(12) United States Patent
Whinnery

(10) Patent No.: US 8,922,100 B2
(45) Date of Patent: Dec. 30, 2014

(54) WOVEN ACTIVE FIBER COMPOSITE

(75) Inventor: Joseph Patrick Wendell Whinnery, Marysville, OH (US)

(73) Assignee: Honda Motor Co., Ltd., Tokyo (JP)

( * ) Notice: Subject to any disclaimer, the term of this patent is extended or adjusted under 35 U.S.C. 154(b) by 1542 days.

(21) Appl. No.: 12/397,695

(22) Filed: Mar. 4, 2009

(65) Prior Publication Data
US 2010/0227521 A1 Sep. 9, 2010

(51) Int. Cl.
*H01L 41/047* (2006.01)
*H01L 41/08* (2006.01)
*D03D 1/00* (2006.01)
*D03D 15/00* (2006.01)
*D03D 15/02* (2006.01)
*H01L 41/29* (2013.01)
*H01L 41/37* (2013.01)

(52) U.S. Cl.
CPC ............ *H01L 41/082* (2013.01); *D03D 1/0088* (2013.01); *D03D 15/00* (2013.01); *D03D 15/0011* (2013.01); *D03D 15/0083* (2013.01); *D03D 15/0094* (2013.01); *D03D 15/02* (2013.01); *H01L 41/047* (2013.01); *H01L 41/29* (2013.01); *H01L 41/37* (2013.01); *D10B 2101/06* (2013.01); *D10B 2101/08* (2013.01); *D10B 2101/20* (2013.01); *D10B 2401/16* (2013.01); *Y10S 310/80* (2013.01)
USPC ........... 310/367; 310/365; 310/366; 310/800; 442/203; 442/208; 442/209; 442/210; 442/228; 442/229; 442/301

(58) Field of Classification Search
USPC ......... 442/192, 203, 208, 209, 210, 228, 229, 442/301; 310/365, 366, 367, 800
See application file for complete search history.

(56) References Cited

U.S. PATENT DOCUMENTS

| | | | |
|---|---|---|---|
| 4,933,230 A * | 6/1990 | Card et al. | 442/178 |
| 5,677,084 A | 10/1997 | Tsukamoto et al. | |
| 5,803,963 A * | 9/1998 | Dry | 106/677 |
| 5,869,189 A | 2/1999 | Hagood, IV et al. | |
| 6,048,622 A | 4/2000 | Hagood, IV et al. | |
| 6,261,360 B1 * | 7/2001 | Dry | 106/677 |
| 6,395,080 B1 | 5/2002 | Cass et al. | |
| 6,578,916 B2 | 6/2003 | Longhi et al. | |
| 6,629,341 B2 | 10/2003 | Wilkie et al. | |
| 6,662,642 B2 | 12/2003 | Breed et al. | |
| 6,725,713 B2 | 4/2004 | Adamson et al. | |
| 6,738,697 B2 | 5/2004 | Breed | |
| 6,748,797 B2 | 6/2004 | Breed et al. | |
| 6,807,853 B2 | 10/2004 | Adamson et al. | |
| 6,850,824 B2 | 2/2005 | Breed | |
| 6,984,902 B1 | 1/2006 | Huang et al. | |
| 6,988,026 B2 | 1/2006 | Breed et al. | |
| 6,998,999 B2 | 2/2006 | Fripp et al. | |
| 7,050,897 B2 | 5/2006 | Breed et al. | |
| 7,096,727 B2 | 8/2006 | Adamson et al. | |
| 7,103,460 B1 | 9/2006 | Breed | |
| 7,197,798 B2 | 4/2007 | Wilkie et al. | |
| 7,234,519 B2 | 6/2007 | Fripp et al. | |
| 7,253,725 B2 | 8/2007 | Breed et al. | |
| 7,258,347 B2 | 8/2007 | Keefe et al. | |
| 7,293,836 B2 | 11/2007 | Browne et al. | |
| 7,313,467 B2 | 12/2007 | Breed et al. | |

(Continued)

*Primary Examiner* — Andrew Piziali
(74) *Attorney, Agent, or Firm* — Plumsea Law Group, LLC

(57) ABSTRACT

A woven active fiber composite is disclosed. The woven active fiber composite includes actuating fibers interwoven with conductive wire electrodes. A method of making the woven active fiber composite is also disclosed.

19 Claims, 15 Drawing Sheets

(56) References Cited

U.S. PATENT DOCUMENTS

| | | |
|---|---|---|
| 7,330,784 B2 | 2/2008 | Johnson et al. |
| 7,345,372 B2 | 3/2008 | Roberts et al. |
| 7,453,163 B2 | 11/2008 | Roberts et al. |
| 7,982,370 B2 * | 7/2011 | Wang et al. .................. 310/339 |
| 2005/0012434 A1 | 1/2005 | Pizzochero et al. |
| 2006/0102455 A1 | 5/2006 | Chiang et al. |
| 2006/0176158 A1 | 8/2006 | Fleming |
| 2007/0028958 A1 | 2/2007 | Retti |
| 2007/0061847 A1 | 3/2007 | Callahan et al. |
| 2007/0126561 A1 | 6/2007 | Breed |
| 2007/0139216 A1 | 6/2007 | Breed |
| 2007/0156320 A1 | 7/2007 | Breed et al. |
| 2007/0164637 A1 * | 7/2007 | Onozawa ..................... 310/344 |
| 2007/0205881 A1 | 9/2007 | Breed |
| 2007/0246898 A1 | 10/2007 | Keefe et al. |
| 2007/0282378 A1 | 12/2007 | Huang et al. |
| 2008/0065290 A1 | 3/2008 | Breed et al. |
| 2008/0216567 A1 | 9/2008 | Breed |

* cited by examiner

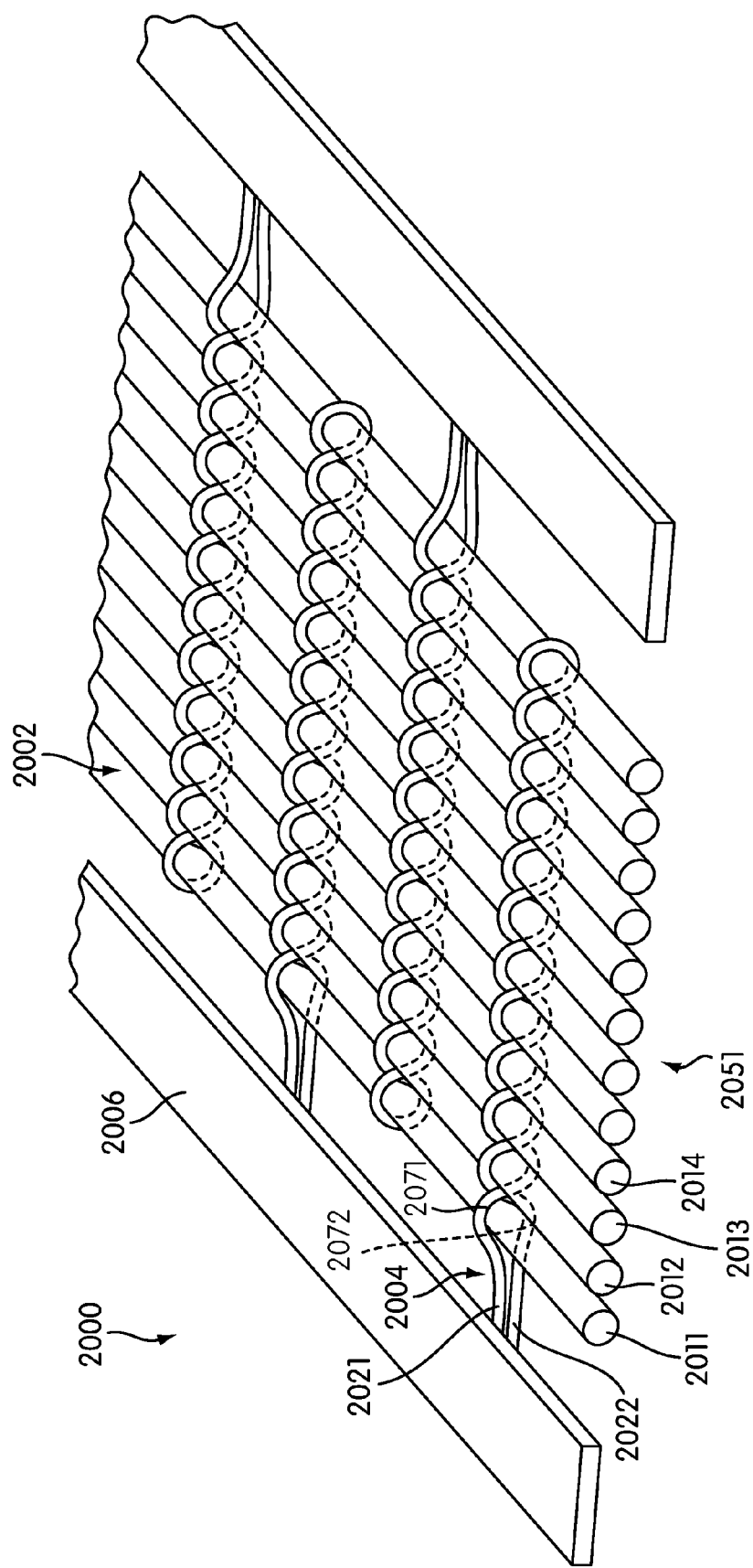

WOVEN ACTIVE FIBER COMPOSITE

BACKGROUND OF THE INVENTION

1. Field of the Invention

The present invention relates to piezoelectric materials and in particular to active fiber composites comprising piezoelectric materials.

2. Description of Related Art

Piezoelectric materials can be arranged as fibers and combined with electrodes to yield active fiber composites. Hagood, IV et al. (U.S. Pat. No. 5,869,189) teaches composites for actuating or sensing deformation. The piezoelectric fibers are arranged in a parallel array with adjacent fibers separated by a soft polymer. Hagood further teaches flexible conductive material extending along the axial extensions of the fibers for imposing or detecting an electrical field.

Wilkie (U.S. Pat. No. 6,629,341) is directed to a method of fabricating a piezoelectric composite apparatus. Wilkie teaches a piezoelectric macro-fiber composite comprising a PZT-5 piezoelectric ceramic material formed into a wafer.

Chiang et al. (U.S. patent application publication number 2006/0102455) teaches an electrochemical actuator. The electrochemical actuator includes a support system including both top and bottom fibers. The top and bottom fibers are inert and are used to support the electrochemical actuators.

The related art has several shortcomings. The related art includes actuator designs with printed electrodes that have a small contact region between the actuating fibers and the electrodes. Furthermore, printed electrode designs can lead to sharp points in the electrodes that may cause localized regions of high stress and/or strain. Additionally, it can be difficult to achieve proper electrode alignment using current designs, which can reduce overall symmetry. All of these features can lead to a reduction in actuation authority and actuation efficiency. There is a need in the art for a design that overcomes some of these shortcomings.

SUMMARY OF THE INVENTION

A woven active fiber composite is disclosed. In one aspect, the invention provides a woven active fiber composite, comprising: a plurality of actuating fibers; a plurality of conductive wire electrodes configured to transfer electrical energy to and from the actuating fibers; and where the plurality of conductive wire electrodes are interwoven with the plurality of actuating fibers.

In another aspect, the plurality of actuating fibers are made of a piezoelectric material.

In another aspect, the piezoelectric material is PZT.

In another aspect, a diameter of the plurality of actuating fibers is in a range between 50 and 150 micrometers.

In another aspect, a diameter of the plurality of conductive wire electrodes is in a range between 5 and 25 micrometers.

In another aspect, the plurality of conductive wire electrodes comprises a first electrode set and a second electrode set.

In another aspect, the first electrode set consists of positive electrodes and the second electrode set consists of negative electrodes.

In another aspect, the first electrode set is interdigitated with the second electrode set.

In another aspect, the plurality of conductive wire electrodes has a substantially sinusoidal shape.

In another aspect, the invention provides a woven active fiber composite, comprising: a plurality of actuating fibers arranged in a generally parallel direction; a plurality of conductive wire electrodes configured to transfer electrical energy to and from the plurality of actuating fibers; and where a portion of the plurality of conductive wire electrodes is disposed between any two adjacent actuating fibers.

In another aspect, adjacent actuating fibers are evenly spaced.

In another aspect, the even spacing of any two adjacent actuating fibers facilitates actuation of the woven active fiber composite in the axial direction.

In another aspect, the spacing between any two adjacent actuating fibers may change during actuation of the woven active fiber composite in the axial direction.

In another aspect, the invention provides a woven active fiber composite, comprising: a plurality of actuating fibers arranged in a generally parallel direction; a plurality of conductive wire electrodes configured to transfer electrical energy to and from the plurality of actuating fibers; and where substantially any two adjacent actuating fibers are spaced apart.

In another aspect, the spacing between adjacent actuating fibers is at least as large as an average diameter of the plurality of conductive wire electrodes.

In another aspect, the spacing between adjacent actuating fibers is larger than the average diameter of the plurality of conductive wire electrodes.

In another aspect, the plurality of conductive wire electrodes is associated with recesses in the plurality of actuating fibers.

In another aspect, the spacing between adjacent actuating fibers is less than the average diameter of the plurality of conductive wire electrodes.

In another aspect, the invention provides a woven active fiber composite, comprising: an actuating fiber including a curved peripheral portion; a conductive wire electrode configured to transfer electrical energy to and from the actuating fiber; and where the conductive wire electrode is configured to contact the actuating fiber over the substantial entirety of the curved peripheral portion.

In another aspect, the actuating fiber includes two curved peripheral portions and where the two curved peripheral portions comprise a substantial majority of a circumference of the actuating fiber.

In another aspect, the conductive wire electrode is configured to contact the actuating fiber over the substantial entirety of the two curved peripheral portions.

In another aspect, the conductive wire electrode is woven with the actuating fiber in a smooth manner to substantially prevent sharp points in the conductive wire electrode.

In another aspect, the curved peripheral portion has a length that is at least as large as an eighth of a circumference of the actuating fiber.

In another aspect, the curved peripheral portion has a length that is at least as large as a quarter of a circumference of the actuating fiber.

In another aspect, the curved peripheral portion has a length that is approximately one half of a circumference of the actuating fiber.

In another aspect, the invention provides a woven active fiber composite, comprising: an actuating fiber including a periodically varying diameter; a first portion of the actuating fiber associated with a first diameter and a second portion of the actuating fiber associated with a second diameter that is less than the first diameter; a conductive wire electrode configured to transfer electrical energy to and from the actuating fiber; and where the conductive wire electrode is configured to contact the actuating fiber at the second portion.

In another aspect, the first portion is associated with a maximum diameter of the actuating fiber.

In another aspect, the second portion is associated with a minimum diameter of the actuating fiber.

In another aspect, a depth of the second portion with respect to the first portion is larger than a diameter of the conductive wire electrode.

In another aspect, a depth of the second portion with respect to the first portion is less than a diameter of the conductive wire electrode.

In another aspect, a depth of the second portion with respect to the first portion is substantially equal to a diameter of the conductive wire electrode.

In another aspect, the first portion comprises a relatively flat outer surface.

In another aspect, the second portion is a recess in the outer surface of the actuating fiber.

In another aspect, the invention provides a method of attaching conductive wire electrodes with actuating fibers, comprising the steps of: arranging a plurality of actuating fibers in a generally parallel direction; weaving a plurality of conductive wire electrodes through the actuating fibers; and thereby attaching the plurality of conductive wire electrodes with the plurality of actuating fibers.

In another aspect, the plurality of actuating fibers is woven with the plurality of conductive wire electrodes using a loom.

In another aspect, each conductive wire electrode of the plurality of conductive wire electrodes is woven across the actuating fibers in a direction perpendicular to a length of the plurality of actuating fibers twice.

In another aspect, the plurality of actuating fibers includes a plurality of recesses.

In another aspect, the plurality of conductive wire electrodes is configured to be woven into the plurality of recesses.

In another aspect, the invention provides a method of making a woven active fiber composite, comprising the steps of: weaving a plurality of actuating fibers with a plurality of conductive wire electrodes; sintering the plurality of actuating fibers after they have been woven with the plurality of conductive wire electrodes; applying an electromagnetic field to the plurality of actuating fibers and the plurality of conductive wire electrodes to pole the plurality of actuating fibers; attaching at least one conductive strip to ends of the plurality of conductive wire electrodes; and applying an epoxy matrix to the plurality of actuating fibers, the plurality of conductive wire electrodes and the at least one conductive strip to form a woven active fiber composite.

In another aspect, the step of applying an electromagnetic field occurs substantially simultaneously with the step of sintering the plurality of actuating fibers.

In another aspect, the plurality of actuating fibers is poled prior to the application of the epoxy matrix.

Other systems, methods, features and advantages of the invention will be, or will become, apparent to one of ordinary skill in the art upon examination of the following figures and detailed description. It is intended that all such additional systems, methods, features and advantages be included within this description and this summary, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like reference numerals designate corresponding parts throughout the different views.

FIG. 20 is an isometric view of an exemplary embodiment of a conductive wire electrode woven around a plurality of actuating fibers of a portion of woven active fiber composite.

DETAILED DESCRIPTION OF THE EXEMPLARY EMBODIMENTS

Figure 1:
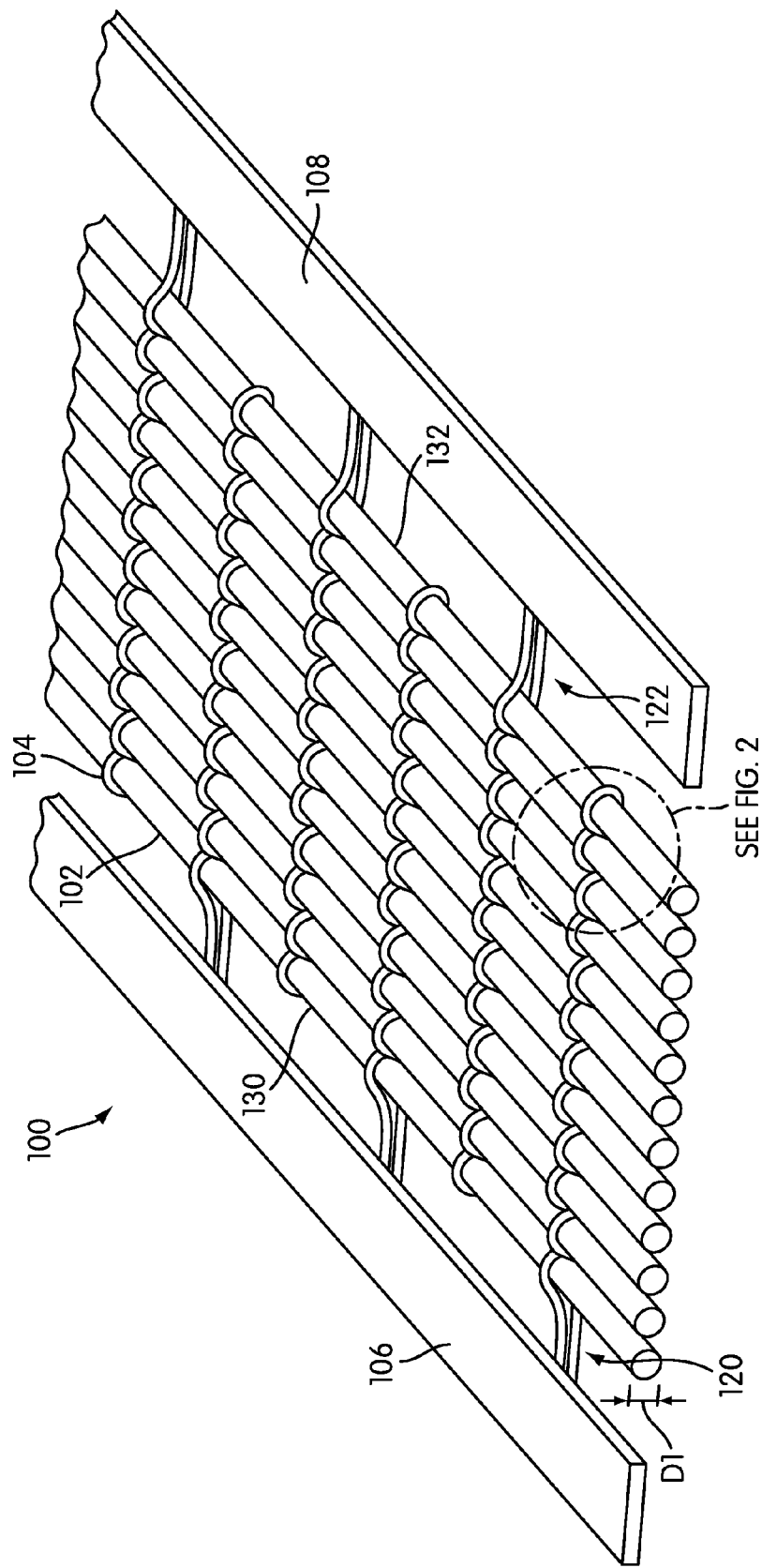
FIG. 1 is an isometric view of an exemplary embodiment of a woven active fiber composite.

FIG. 1 is an isometric view of an exemplary embodiment of woven active fiber composite 100. The term "active fiber composite" as used throughout the specification and claims refers to a composite material formed by combining actuating fibers with one or more sets of electrodes. The term active fiber composite is not intended to be limited to particular actuating materials. Furthermore, the term active fiber composite is not intended to be limited to particular uses. Active fiber composites as discussed throughout this detailed description may be used in various applications, including, but not limited to energy harvesting applications, structural control applications, as well as other types of applications. In one example, one-time use lithium batteries could be replaced with energy harvesting active fiber composite materials to supply power in various electrically powered devices. In another example, active fiber composites could be used in structural control applications. Examples of structural control applications include, but are not limited to, dynamic twist control applications, structural acoustic control applications, radiated noise reduction applications, as well as other applications.

For purposes of clarity, woven active fiber composite 100 is illustrated independently of any laminating material or epoxy matrix that may be used to encapsulate one or more components of woven active fiber composite 100. It should be understood, however, that in an exemplary embodiment, woven active fiber composite 100 may be laminated or otherwise associated with a protective outer layer in some embodiments. Details of applying an epoxy matrix to a woven active fiber composite are discussed later in this detailed description.

A woven active fiber composite can include fibers formed of one or more piezoelectric materials. Examples of various piezoelectric materials include, but are not limited to, natural and man made piezoelectric crystals such as Berlinite, cane sugar, Quartz, Rochelle salt, Topaz, Tourmaline Group Minerals, Gallium orthophosphate, and Langasite. Additionally, other piezoelectric materials include man made ceramics such as Barium titanate, Lead titanate, Lead Zirconate titanate, Potassium niobate, Lithium niobate, Lithium tantalite, Sodium tungstate, as well as polymers such as polyvinylidene fluoride (PVDF). It should be understood that this list is not meant to be exclusive and other types of piezoelectric materials could also be used to make actuating fibers for an active fiber composite.

Woven active fiber composite 100 includes a plurality of actuating fibers 102. In this exemplary embodiment, actuating fibers 102 are fibers made of lead zirconate titanate, hereby referred to as PZT. In other embodiments, actuating fibers 102 could be made of other piezoelectric materials, as previously discussed. Actuating fibers made of PZT are known and are currently produced by the VSSP process by Advanced Cerametrics Inc. In other cases, actuating fibers 102 may be made of piezoelectric materials that are spun into a yarn to provide a continuous desired length. For example, actuating fibers 102 may be made of many short PZT filaments that are spun into a yarn to provide a continuous desired length for actuating fibers 102.

Generally, a woven active fiber composite can comprise any number of actuating fibers. For purposes of clarity, the current embodiment includes a relatively small number of actuating fibers. In particular, the current embodiment includes approximately 12 actuating fibers. In other embodiments, however, a woven active fiber composite can include a much larger number of actuating fibers. In other embodiments, a woven active fiber composite can include N actuating fibers, where N is any number equal or greater than 1. In another exemplary embodiment, a woven active fiber composite could include approximately 777 actuating fibers.

Woven active fiber composite 100 can be associated with one or more directions. The term "longitudinal direction" as used throughout this detailed description and in the claims refers to a direction that is substantially parallel with a length of woven active fiber composite 100. Likewise, the term "lateral direction" as used throughout this detailed description and in the claims refers to a direction that is generally parallel with a width of woven active fiber composite 100. In other words, the lateral direction is generally perpendicular to the longitudinal direction. It should be understood that woven active fiber composite 100 may be configured to bend, twist or otherwise deform in some embodiments. In such cases, the designations of a longitudinal direction and a lateral direction should be understood to mean generally in a direction along the length and width, respectively, of woven active fiber composite 100. Furthermore, the terms may be used locally to describe a direction generally parallel with a length of a particular actuating fiber or a direction generally parallel with a width of a particular actuating fiber.

Actuating fibers of a woven active fiber composite are configured to undergo various types of actuation. In some embodiments, actuating fibers may be configured to undergo d31 actuation, which is actuation in a lateral direction of a woven active fiber composite. In other embodiments, actuating fibers may be configured to undergo d33 actuation, which is actuation in the axial direction. The term "axial direction" as used throughout this detailed description and in the claims refers to a direction that is oriented along the length of an actuating fiber. In many cases, the axial direction may be substantially parallel to a longitudinal direction of a woven active fiber composite. As actuating fibers undergo actuation in the axial direction, actuating fibers may expand or contract in the axial direction, depending on the polarity of the voltage applied to the actuating fibers. As a plurality of actuating fibers undergo actuation, this arrangement results in lengthwise expansion or contraction of the entire woven active fiber composite in a generally longitudinal direction.

Actuating fibers 102 may be oriented in a substantially parallel direction with one another. In the current embodiment, actuating fibers 102 may be disposed adjacent to one another in a generally lateral direction. With this arrangement, actuating fibers 102 may form a single layer for woven active fiber composite 100.

A woven active fiber composite may also include a plurality of electrodes. Generally, any type of electrodes may be used. In some embodiments, printed electrodes can be used. In an exemplary embodiment, conductive wire electrodes may be used.

Generally, any type of conductor may be used for a conductive wire electrode. Examples of conductive materials include, but are not limited to, metallic conductors and non-metallic conductors. Examples of metallic conductors include, but are not limited to, copper, silver and aluminum. Examples of non-metallic conductors include, but are not limited to, graphite, salt solutions and plasmas. Typically, a conductive material may be used that can be formed into a wire. In an exemplary embodiment, the conductive wire may be an aluminum wire. However, in other embodiments, another type of conductive wire could be used. It should be understood that this list is not meant to be exclusive and other types of conductive materials could also be used as electrodes for an active fiber composite.

Woven active fiber composite 100 can include a plurality of conductive wire electrodes 104. In an exemplary embodiment, each of conductive wire electrodes 104 comprises a conductive wire electrode. In some embodiments, a conductive wire electrode may comprise a single filament. In other embodiments, a conductive wire electrode may comprise a multi-filament braid. As previously discussed, in one embodiment, conductive wire electrodes 104 may be made of aluminum wire.

Conductive wire electrodes 104 may be oriented in any direction with respect to actuating fibers 102. In some cases, conductive wire electrodes 104 can be disposed in a generally parallel direction with actuating fibers 102. In other cases, conductive wire electrodes 104 can be disposed in a generally perpendicular direction with actuating fibers 102. In still other cases, conductive wire electrodes 104 can be disposed in another direction with respect to actuating fibers 102. In an exemplary embodiment, conductive wire electrodes 104 are disposed in a generally perpendicular direction with actuating fibers 102. In other words, the length of conductive wire electrodes 104 extends in a lateral direction. With this arrangement, a single conductive wire electrode may overlap with a plurality of actuating fibers 102.

In some embodiments, plurality of conductive wire electrodes 104 may further comprise first electrode set 120 and second electrode set 122. First electrode set 120 comprises a set of conductive wire electrodes that extend outward from first lateral portion 130 of woven active fiber composite 100. Likewise, second electrode set 122 may comprise a set of conductive wire electrodes that extend outward from second lateral portion 132 of woven active fiber composite 100.

In some embodiments, each electrode set may be associated with a particular polarity. In this embodiment, first electrode set 120 may be a set of positive electrodes. Likewise, second electrode set 122 may be a set of negative electrodes. In other embodiments, first electrode set 120 may be a set of negative electrodes. Likewise, in other embodiments, second electrode set 122 may be a set of positive electrodes. In still other embodiments, first electrode set 120 and second electrode set 122 could both include a mix of positive and negative electrodes.

Generally, first electrode set 120 and second electrode set 122 can include any number of conductive wire electrodes. In some embodiments, first electrode set 120 and second electrode set 122 can include a different number of conductive wire electrodes. In an exemplary embodiment, first electrode set 120 and second electrode set 122 can include a substantially equal number of conductive wire electrodes. For purposes of clarity, first electrode set 120 and second electrode set 122 are each shown to include three conductive wire electrodes. However, in other embodiments, first electrode set 120 and second electrode set 122 could each include N conductive wire electrodes, where N is any number greater than or equal to 1. In another exemplary embodiment, first electrode set 120 includes approximately 450 conductive wire electrodes. Also, second electrode set 122 includes approximately 450 conductive wire electrodes.

In some embodiments, each of the plurality of conductive wire electrodes 104 may be further associated with a conductive strip. In this exemplary embodiment, each of the plurality of conductive wire electrodes 104 is associated with either first conductive strip 106 or second conductive strip 108. In one embodiment, first electrode set 120 may be attached to first conductive strip 106. Also, second electrode set 122 may be attached to second conductive strip 108. First conductive strip 106 and second conductive strip 108 may be further associated with other electrical devices, components or systems. With this arrangement, conductive wire electrodes 104 may be in electrical communication with other components, systems or devices via first conductive strip 106 and second conductive strip 108.

Conductive wire electrodes 104 may be arranged in any manner with respect to actuating fibers 102. In some embodiments, conductive wire electrodes from first electrode set 120 may be interdigitated with conductive wire electrodes from second electrode set 122. In other words, adjacent conductive wire electrodes may have opposite polarities. This interdigitated arrangement facilitates actuation control and efficiency of woven active fiber composite 100.

Woven active fiber composite 100 may include provisions for associating conductive wire electrodes 104 with actuating fibers 102. In some embodiments, conductive wire electrodes 104 may be laid across a top surface of actuating fibers 102. In other embodiments, conductive wire electrodes 104 may be laid across a bottom surface of actuating fibers 102. In an exemplary embodiment, conductive wire electrodes 104 may be woven between actuating fibers 102.

Generally, conductive wire electrodes 104 can be woven with actuating fibers 102 in any known manner. Examples of different weaving patterns that could be used include, but are not limited to, plain weaves, twill weaves, and any other type of weave. In this exemplary embodiment, conductive wire electrodes 104 are woven with actuating fibers 102 in a generally plain weave pattern.

Figure 2:
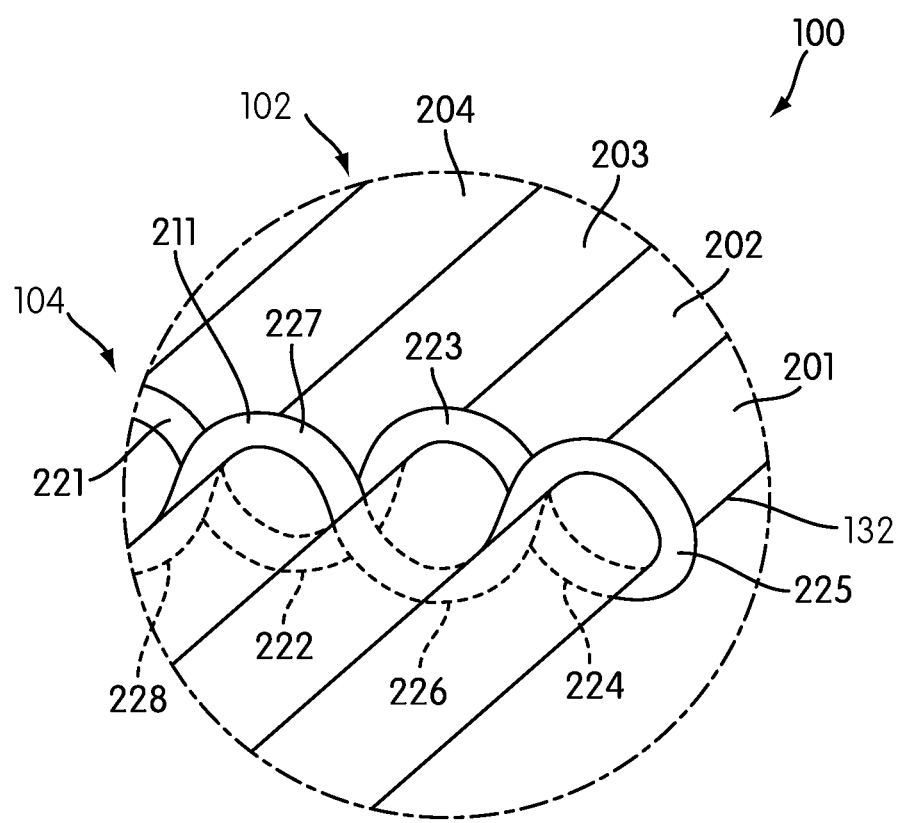
FIG. 2 is an enlarged view of an exemplary embodiment of a plain weave pattern of a woven active fiber composite.

FIG. 2 illustrates an enlarged view of an exemplary embodiment of a plain weave pattern of woven active fiber composite 100. In this embodiment, first actuating fiber 201, second actuating fiber 202, third actuating fiber 203 and fourth actuating fiber 204 of actuating fibers 102 are disposed adjacent to one another in a generally lateral direction. Furthermore, conductive wire electrode 211 of conductive wire electrodes 104 is clearly seen weaving through first actuating fiber 201, second actuating fiber 202, third actuating fiber 203 and fourth actuating fiber 204.

In this embodiment, conductive wire electrode 211 is configured to weave through first actuating fiber 201, second actuating fiber 202, third actuating fiber 203 and fourth actuating fiber 204 in an alternating manner. In particular, conductive wire electrode 211 includes first portion 221 that is disposed over fourth actuating fiber 204, second portion 222 that is disposed beneath third actuating fiber 203, third portion 223 that is disposed over second actuating fiber 202 and fourth portion 224 that is disposed beneath first actuating fiber 201.

Because first actuating fiber 201 forms second lateral portion 132 of woven active fiber composite 100, a portion of conductive wire electrode 211 may be wrapped around first actuating fiber 201. In this case, fifth portion 225 may be disposed around first actuating fiber 201. Conductive wire electrode 211 may then be woven back through actuating fiber 201, second actuating fiber 202, third actuating fiber 203 and fourth actuating fiber 204. In particular, sixth portion 226 of conductive wire electrode 211 may be disposed beneath second actuating fiber 202, seventh portion 227 of conductive wire electrode 211 may be disposed over third actuating fiber 203 and eighth portion 228 of conductive wire electrode 211 may be disposed beneath fourth actuating fiber 204.

Conductive wire electrode 211 may be woven into the remaining actuating fibers 102 in a similar manner. In particular, each of conductive wire electrodes 104 may be woven through actuating fibers 102 in a lateral direction of woven active fiber composite 100, wrapped around a lateral portion, and then re-woven through actuating fibers 102 in a reverse direction.

Figure 3:
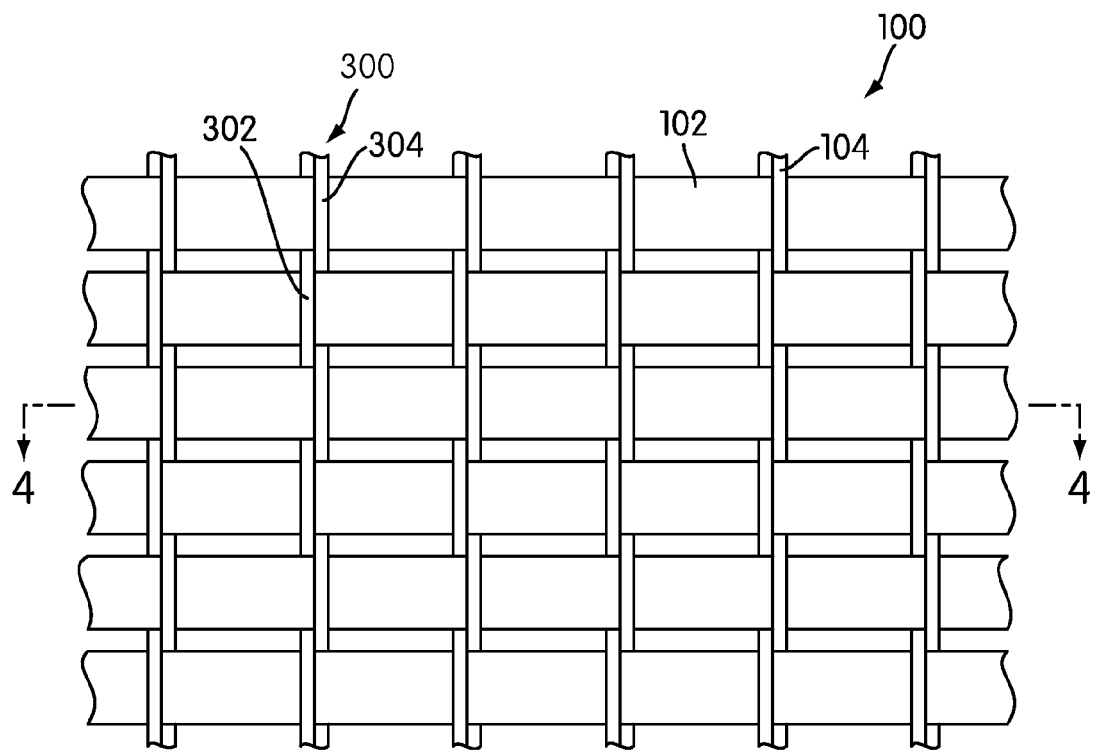
FIG. 3 is a schematic view of an exemplary embodiment of a general weaving pattern of a woven active fiber composite.

FIG. 3 illustrates a schematic view of an exemplary embodiment of a general weaving pattern of woven active fiber composite 100. For purposes of clarity, only a portion of woven active fiber composite 100 is illustrated in FIG. 3. In this embodiment, each of conductive wire electrodes 104 is woven through actuating fibers 102 twice. For example, conductive wire electrode 300 may include first portion 302 and second portion 304. First portion 302 is woven in a first lateral direction through actuating fibers 102. Also, second portion 304 is woven in a second lateral direction through actuating fibers 102. Furthermore, first portion 302 may be disposed adjacent to second portion 304. With this arrangement, conductive wire electrode 300 may be tightly bound with actuating fibers 102. Furthermore, this method of weaving actuating fibers 102 provides for some portions of each of conductive wire electrodes 104 to be disposed over actuating fibers 102 and other portions to be disposed beneath actuating fibers 102. Further details of a process for manufacturing woven active fiber composite 100 are discussed later in this detailed description.

In some embodiments, the sizes and/or shapes of actuating fibers and conductive wire electrodes may vary. In some cases, varying the sizes and/or shapes of actuating fibers and conductive wire electrodes may modify the feature size of an electrode pattern. Using smaller electrode feature sizes may provide for increased robustness for a woven active fiber composite, especially over traditional active fiber composite designs that have a minimum electrode feature size. In other cases, modifying the sizes and/or shapes of actuating fibers and conductive wire electrodes may allow for different structural properties for the woven active fiber composite.

Actuating fibers 102 can have any size. In particular, the length and diameter of actuating fibers 102 can vary. In the current embodiment, only a portion of the length of actuating fibers 102 is illustrated. However, it should be understood that actuating fibers 102 could have any length necessary for constructing a woven active fiber composite of a particular length. In an exemplary embodiment, woven active fiber composite 100 may be approximately 150 millimeters long.

Generally, actuating fibers 102 may have any cross sectional shape. Examples of different cross sectional shapes include, but are not limited to, squares, rectangles, circles, triangles, regular shapes, irregular shapes as well as any other shapes. In this exemplary embodiment, actuating fibers 102 may be associated with a generally circular cross sectional shape.

Referring back to FIG. 1, in this embodiment, actuating fibers 102 may be associated with diameter D1. Generally, diameter D1 can have any value. In some embodiments, diameter D1 may have a value in the range of 10 micrometers to 200 micrometers. In other embodiments, diameter D1 may have a value in the range of 50 micrometers to 150 micrometers. In an exemplary embodiment, diameter D1 may have a value of approximately 75 micrometers.

In different embodiments, the shape of conductive wire electrodes 104 can also vary. In some embodiments, conductive wire electrodes 104 can have any cross sectional shape that has been previously discussed for actuating fibers 102. In an exemplary embodiment, conductive wire electrodes 104 may have a generally circular cross sectional shape.

In different embodiments, the size of conductive wire electrodes 104 can also vary. In particular, the length and diameter of conductive wire electrodes 104 can vary. In the current embodiment, the length of conductive wire electrodes 104 generally extends over a width of woven active fiber composite 100. In particular, the length of conductive wire electrodes in first electrode set 120 extend from first conductive strip 106 to second lateral portion 132 of woven active fiber composite 100 and back to first conductive strip 106 again. In other words, the length of conductive wire electrodes in first electrode set 120 is approximately twice the distance between first conductive strip 106 and second lateral portion 132 of woven active fiber composite 100. Likewise, the length of conductive wire electrodes in second electrode set 122 extend from second conductive strip 108 to first lateral portion 130 and back to second conductive strip 108. In other words, the length of conductive wire electrodes in second electrode set 122 is approximately twice the distance between second conductive strip 108 and first lateral portion 130 of woven active fiber composite 100. In an exemplary embodiment, conductive wire electrodes 104 may be approximately 183 millimeters long.

Figure 4:
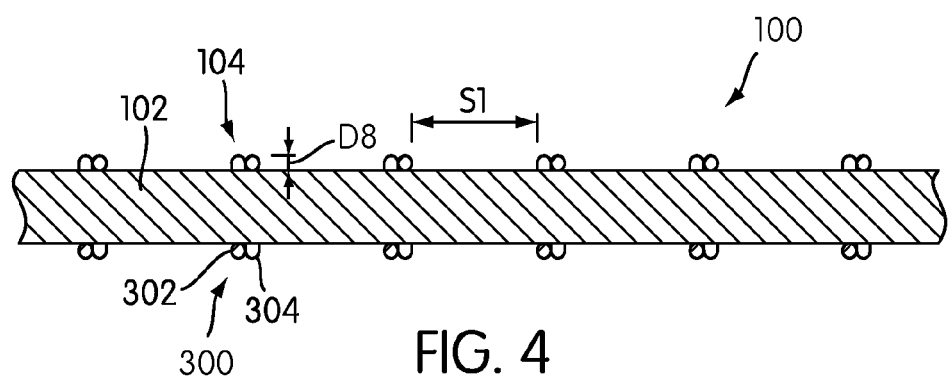
FIG. 4 is a schematic cross sectional view of an exemplary embodiment of a woven active fiber composite.

Referring to FIG. 4, conductive wire electrodes 104 may be associated with diameter D8. Generally, diameter D8 can have any value. In some embodiments, diameter D8 may have a value in the range of 1 micrometer to 200 micrometers. In other embodiments, diameter D8 may have a value in the range of 5 micrometers to 25 micrometers. In an exemplary embodiment, diameter D8 may have a value of approximately 17 micrometers.

In some embodiments, the spacing between adjacent conductive wire electrodes can vary. In some cases, the spacing between adjacent conductive wire electrodes may be irregular. In other cases, the spacing between adjacent conductive wire electrodes may be regular. In an exemplary embodiment, adjacent conductive wire electrodes may be evenly spaced. This arrangement may help to create substantially uniform electromagnetic fields for interacting with actuating fibers. Additionally, this arrangement may help create an even weave pattern that facilitates substantially uniform composite strength over the entirety of a woven active fiber composite.

Referring to FIG. 4, adjacent conductive wire electrodes 104 may be spaced apart by spacing S1. In some embodiments, the value of spacing S1 may be in the range between 5 and 500 micrometers. In other embodiments, the value of spacing S1 may be in the range between 100 and 200 micrometers. In an exemplary embodiment, the value of spacing S1 may be approximately 150 micrometers. This value for spacing S1 facilitates a proper electromagnetic field strength along woven active fiber composite 100.

A woven active fiber composite may be used in a variety of applications, as previously discussed. The performance of an active fiber composite is directly related to the structural properties of the active fiber composite. For example, the general topological and/or geometric structure of the active fiber composite can have a direct impact on the degree of actuation authority as well as actuation efficiency. Using a woven topology for an active fiber composite may facilitate increased actuation authority and efficiency.

Current active fiber composite technology uses pre-printed electrodes that are pressed or laminated onto actuating fibers. In some cases, using pre-printed electrodes can make electrode alignment along top and bottom surfaces of the actuating fibers difficult. Improper alignment of the electrodes can lead to non-symmetric electromagnetic fields in some cases, which can reduce the actuation efficiency of the active fiber composite. A woven active fiber composite can include provisions for facilitating an alignment of electrodes to help maintain generally symmetric fields and increased actuation efficiency.

Referring to FIG. 4, conductive wire electrodes 104 are generally aligned in a vertical direction due to the woven structure of woven active fiber composite 100. The term "vertical direction" as used throughout this detailed description and in the claims refers to a direction that is perpendicular to both the longitudinal direction and the lateral direction. As seen in FIGS. 3 and 4, first portion 302 and second portion 304 of conductive wire electrode 300 may be disposed adjacent to one another as conductive wire 300 is woven through actuating fibers 102. By establishing a tight woven connection between conductive wire electrode 300 and actuating fibers 102, first portion 302 and second portion 304 may be prevented from separating in the longitudinal direction and preventing proper alignment with respect to the vertical direction. This arrangement substantially eliminates the need for manual adjustment of conductive wire electrodes to create and/or maintain proper alignment. Instead, in some embodiments, this vertical alignment may be naturally achieved during the weaving process.

In some embodiments, a woven active fiber composite may include actuating fibers with periodically varying diameters. By varying the diameters of the actuating fibers periodically, conductive wire electrodes may be applied at period minimums of the actuating fibers diameters. In some cases, this may help present a generally flat outer surface for a woven active fiber composite. Following integration of the woven active fiber composite with an epoxy matrix, a more uniform transmission of load through the epoxy matrix is achieved by virtue of the micro-texturing of the woven conductive wire electrodes and the variable diameter actuating fibers.

Figure 5:
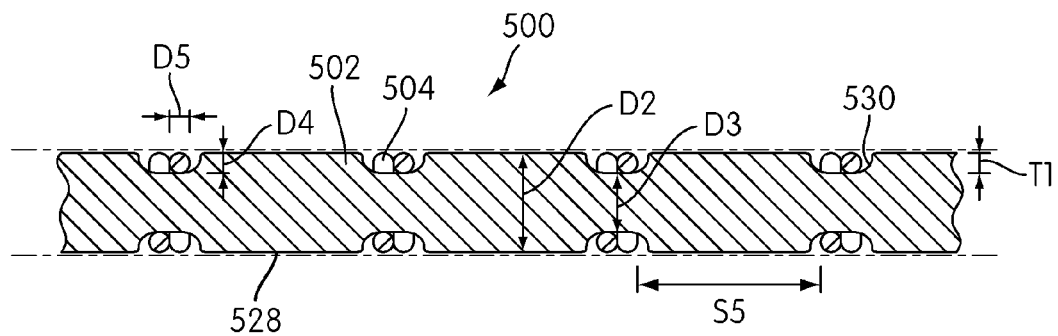
FIG. 5 is a side cross sectional view of an illustrative embodiment of a woven active fiber composite.

FIG. 5 illustrates a side cross sectional view of another exemplary embodiment of woven active fiber composite 500. In this embodiment, actuating fiber 502 is configured with a variable diameter. In particular, actuating fiber 502 includes maximum diameter D2 at first portions 528. In some cases, first portions 528 may extend over a majority of the length of actuating fiber 502. First portions 528 may be associated with a generally constant diameter. Likewise, actuating fiber 502 includes recessed portions 530. Recessed portions 530 may be associated with minimum diameter D3 of actuating fiber 502.

Recessed portions 530 may be configured to receive conductive wire electrodes 504. In some embodiments, conductive wire electrodes 504 may have diameter D4. Likewise, recessed portions 530 may have depth T1 as measured along the radius of actuating fiber 502. In some cases, diameter D4 may be larger than depth T1. In other cases, diameter D4 may be smaller than depth T1. In an exemplary embodiment, diameter D4 may be substantially similar to depth T1. With this arrangement, actuating fiber 502 and conductive wire electrodes 504 may form a substantially flat outer surface for woven active fiber composite 500. This arrangement may facilitate a more uniform transmission of load throughout woven active fiber composite 500.

In different embodiments, adjacent recessed portions 530 may be spaced apart different distances. By changing the spacing between adjacent recessed portions, the spacing between adjacent conductive wire electrodes 504 may be varied. Referring to FIG. 5, adjacent conductive wire electrodes 504 may be spaced apart by spacing S5. In one embodiment, the value of spacing S5 may be approximately 150 micrometers. In other embodiments, recessed portions 530 may be spaced apart other distances to provide different spacing between adjacent conductive wire electrodes. With this arrangement, conductive wire electrodes 504 may be spaced apart to provide proper electromagnetic field strength along woven active fiber composite 500.

Figure 6:
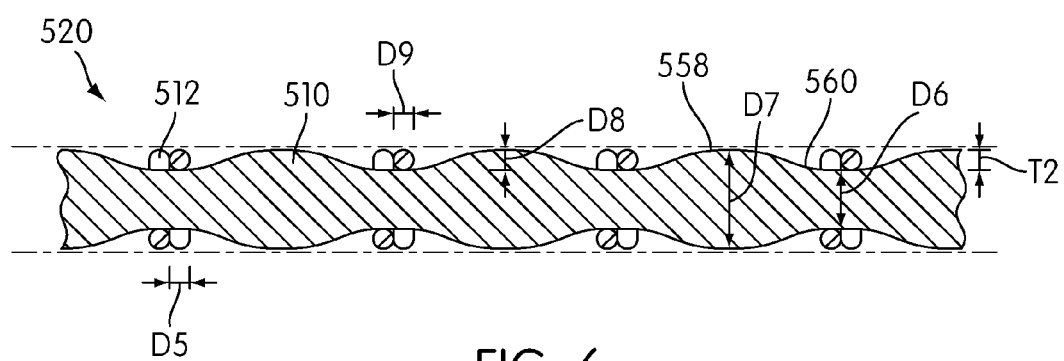
FIG. 6 is a side cross sectional view of an illustrative embodiment of a woven active fiber composite.

FIG. 6 illustrates a side cross sectional view of another embodiment of woven active fiber composite 520. In this embodiment, actuating fiber 510 is configured with a variable diameter. In particular, actuating fiber 510 includes maximum diameter D7 at first portions 558. Likewise, actuating fiber 510 includes second portions 560. Second portions 560 may be associated with minimum diameter D6 of actuating fiber 510. In an exemplary embodiment, the diameter of actuating fiber 510 may be continuously variable from first portions 558 to second portions 560, in a periodic manner. In other words, actuating fiber 510 may have a generally wavy profile with crests at first portions 558 and troughs at second portions 560.

Second portions 560 may be configured to receive conductive wire electrodes 512. In some embodiments, conductive wire electrodes 512 may have diameter D5. Likewise, second portions 560 may have depth T2. In other words, the radial distance between first portions 558 and second portions 560 may be approximately depth T2. In some cases, diameter D5 may be larger than depth T2. In other cases, diameter D5 may be smaller than depth T2. In an exemplary embodiment, diameter D5 may be substantially similar to depth T2. With this arrangement, actuating fiber 510 and conductive wire electrodes 512 may form a substantially flat outer surface for woven active fiber composite 520. This arrangement may facilitate a more uniform transmission of load throughout woven active fiber composite 520.

In some embodiments, the diameter of an actuating fiber may not be varied around the entire circumference. For example, in some cases, the diameter may only be varied along upper and lower portions of the actuating fiber that are associated with upper and lower surfaces of the active fiber composite. In other embodiments, however, the diameter may be varied over the entire circumference of the actuating fiber. With this arrangement, conductive wire electrodes may be partially recessed around the entire circumference of the actuating fiber.

In some embodiments, by varying the diameter of an actuating fiber, the spacing between adjacent fibers can be varied. For example, if a conductive wire electrode is associated with a recess of an actuating fiber, only a portion of the conductive wire electrode may extend outwards of the actuating fiber. With this arrangement, the spacing between actuating fibers can be adjusted as less of the conductive wire electrode is disposed between adjacent actuating fibers.

These embodiments illustrated in FIGS. 5 and 6 are only meant to be illustrative. In other embodiments, actuating fibers could have different cross sectional profiles. In other words, the diameter of the actuating fibers could vary in any generally periodic manner along the length of the actuating fibers. In still other embodiments, the diameter of the actuating fibers could vary in a generally non-periodic manner along the length of the actuating fibers.

Woven active fiber composites can include provisions for spacing apart adjacent fibers to increase the efficiency of axial actuation, also known as d33 actuation. Current active fiber composite designs use two-dimensional electrode arrays that do not allow for controlled spacing between fibers in the active fiber composite. Instead, using a woven active fiber composite, spacing between adjacent actuating fibers can be created through the woven structure. In some cases, the weaving of conductive wire electrodes may be naturally configured to provide a consistent spacing between adjacent actuating fibers.

Figure 7:
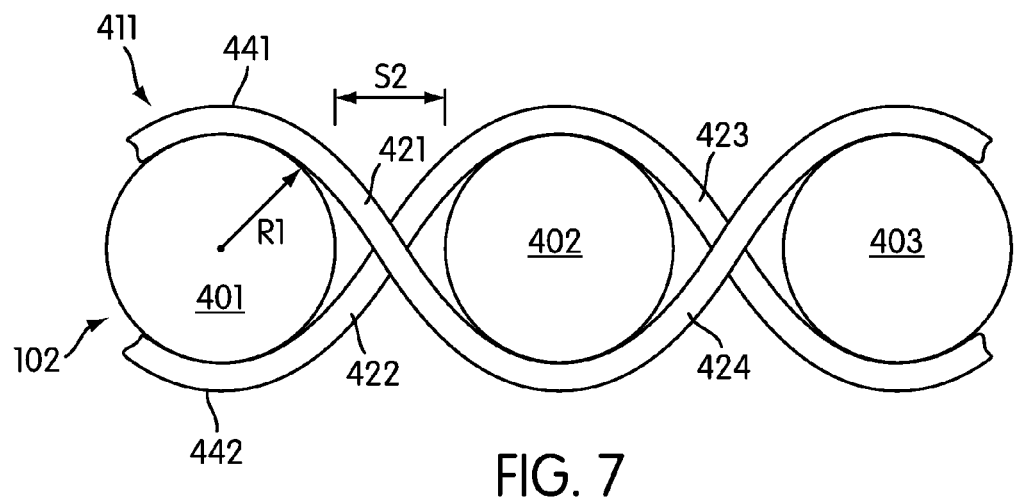
FIG. 7 is a front cross sectional view of an exemplary embodiment of a portion of a woven active fiber composite.

FIG. 7 illustrates a front cross sectional view of an exemplary embodiment of a portion of woven active fiber composite 100. For purposes of clarity, only three actuating fibers are shown. In this embodiment, first actuating fiber 401, second actuating fiber 402 and third actuating fiber 403 are spaced apart from one another because of the woven structure of woven active fiber composite 100. In particular, first portion 421 and second portion 422 of conductive wire electrode 411 are disposed between first actuating fiber 401 and second actuating fiber 402. Likewise, third portion 423 and fourth portion 424 of conductive wire electrode 411 are disposed between second actuating fiber 402 and third actuating fiber 403. In some cases, the presence of first portion 421, second portion 422, third portion 423 and fourth portion 424 between adjacent actuating fibers provides for slight spacing between adjacent actuating fibers.

In this embodiment, first actuating fiber 401 and second actuating fiber 402 may be spaced apart by spacing S2, prior to actuation. Generally, spacing S2 may be at least as large as a diameter of conductive wire electrode 411. Furthermore, spacing S2 may be slightly larger than a diameter of conductive wire electrode 411 due to the generally diagonal orientations of first portion 421 and second portion 422 with respect to first actuating fiber 401 and second actuating fiber 402.

Generally, the value of spacing S2 can be varied. In some embodiments, the diameter of conductive wire electrode 411 can be varied to change the value of spacing S2 prior to actuation. In other embodiments, the slack in the weave of conductive wire electrode 411 with respect to the actuating fibers can be adjusted to change the value of spacing S2. In some embodiments, the value of spacing S2 may be approximately equal to the diameter of conductive wire electrode 411. In one embodiment, the value of spacing S2 may be in the range between 10 to 25 micrometers.

In some embodiments, second actuating fiber 402 and third actuating fiber 403 are separated by a substantially similar spacing to spacing S2. Additionally, the remaining actuating fibers of woven active fiber composite 100 may also be separated by a substantially similar value to spacing S2. In other words, due to the weaving of conductive wire electrodes, woven active fiber composite 100 may be configured with substantially consistent spacing S2 between adjacent actuating fibers. With substantially consistent spacing S2 between adjacent actuating fibers of woven active fiber composite 100, increased axial actuation efficiency can be achieved.

Figure 8:
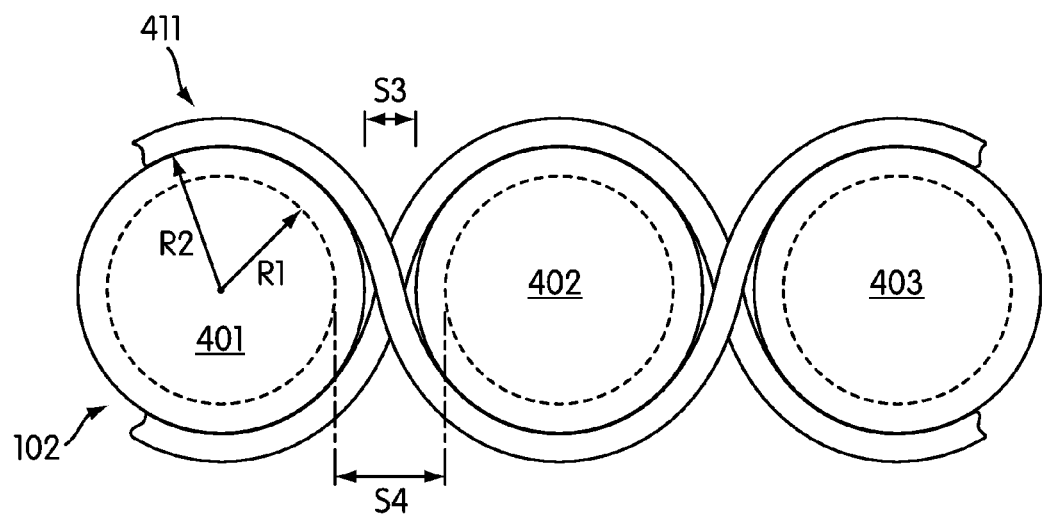
FIG. 8 is a front cross sectional view of an exemplary embodiment of a portion of a woven active fiber composite.

Referring to FIGS. 7 and 8, first actuating fiber 401, second actuating fiber 402 and third actuating fiber 403 may undergo axial actuation when a voltage is applied across conductive wire electrodes 104, including conductive wire electrode 411. In some embodiments, axial actuation may cause radii of first actuating fiber 401, second actuating fiber 402 and third actuating fiber 403 to contract as first actuating fiber 401, second actuating fiber 402 and third actuating fiber 403 extend in an axial direction. In other embodiments, axial actuation may cause a radius of first actuating fiber 401, second actuating fiber 402 and third actuating fiber 403 to expand. For example, in some cases, first actuating fiber 401, second actuating fiber 402 and third actuating fiber 403 may contract in an axial direction when a negative voltage is applied. This can cause radii of first actuating fiber 401, second actuating fiber 402 and third actuating fiber 403 to expand slightly. With spacing S2 between adjacent actuating fibers of woven active fiber composite 100, woven active fiber composite 100 may accommodate changes in radii of first actuating fiber 401, second actuating fiber 402 and third actuating fiber 403.

As seen in FIG. 7, first actuating fiber 401 has an initial radius of R1. Second actuating fiber 402 and third actuating fiber 403 have substantially similar sized radii. During axial deflection of actuating fibers 102, first actuating fiber 401, second actuating fiber 402 and third actuating fiber 403 may expand in the axial direction, as seen in FIG. 8. In some cases, first actuating fiber 401 may have a final radius R2 during the peak of axial deflection. Similarly, second actuating fiber 402 and third actuating fiber 403 also have substantially similar sized radii at this point.

This increase in the size of the radii of first actuating fiber 401, second actuating fiber 402 and third actuating fiber 403 generally decreases the spacing between adjacent actuating fibers. In this case, the spacing between first actuating fiber 401 and second actuating fiber 402 has decreased from an initial spacing S2 to a final spacing S3. As seen in FIG. 8, conductive wire electrode 411 may tighten around first actuating fiber 401, second actuating fiber 402 and third actuating fiber 403.

As previously discussed, traditional active fiber composite designs are configured with substantially no spacing between adjacent actuating fibers. Therefore, the actuating fibers of these traditional designs do not have room to expand. In contrast, actuating fibers 102 in woven active fiber composite 100 provides spacing between adjacent actuating fibers. The spacing between adjacent actuating fibers may be decreased or increased during actuation of woven active fiber composite 100 in an axial direction. With spacing between adjacent actuating fibers, woven active fiber composite 100 can accommodate potential increases in diameter of actuating fibers 102 during actuation in the axial direction. This arrangement facilitates increased actuation authority and efficiency.

A woven active fiber composite may include provisions for reducing sharp points that are typically associated with printed electrodes that are pressed onto a fiber pre-form. Sharp points in an electrode configuration may lead to increased fatigue and premature aging by promoting localized regions of continued stress and/or strain. In an exemplary embodiment, the woven structure of a woven active fiber composite may help decrease the tendency for electrodes to form sharp points.

Referring back to FIG. 7, conductive wire electrode 411 is generally configured to smoothly wrap around first actuating fiber 401, second actuating fiber 402 and third actuating fiber 403. In particular, as conductive wire electrode 411 is woven between first actuating fiber 401, second actuating fiber 402 and third actuating fiber 403, conductive wire electrode 411 may form an approximately sinusoidal shape. For example, conductive wire electrode 411 includes first wire segment 441 that extends from first actuating fiber 401 to third actuating fiber 403. Furthermore, first wire segment 441 extends over first actuating wire 401, beneath second actuating fiber 402 and over third actuating fiber 403 to form an approximately sinusoidal shape. Likewise, second wire segment 442 is woven through first actuating fiber 401, second actuating fiber 402 and third actuating fiber 403 in a similar way. In particular, second wire segment 442 may be associated with an approximately sinusoidal shape as well. With this approximately sinusoidal arrangement, first wire segment 441 and second wire segment 442 may be curved in a smooth manner that helps to prevent the formation of sharp points in conductive wire electrode 411.

It should be understood that the shape of the remaining conductive wire electrodes of conductive wire electrodes 104 may have a substantially similar shape to conductive wire electrode 411. In particular, each of conductive wire electrodes 104 can be wrapped around actuating fibers 102 in a manner that facilitates a smooth approximately sinusoidal shape. This arrangement may help prevent the formation of sharp points in conductive wire electrodes 104 in any portion of woven active fiber composite 100.

It should be understood that the shape of first wire segment 441 and second wire segment 442 are only approximately sinusoidal in the current embodiment. In other embodiments, first wire segment 441 and second wire segment 442 may be configured with any generally smooth shape that does not include sharp points.

Previous designs for active fiber composites have used a substantially flat conductive electrode that is printed over adjacent actuating fibers. Because the actuating fibers are round, the contact region is generally small between the substantially flat electrodes and the actuating fibers. This can lead to reduced actuation authority and efficiency. In contrast, a woven active fiber composite includes provisions for increasing the contact area between conductive wire electrodes and actuating fibers in order to increase actuation authority and efficiency.

Figure 9:
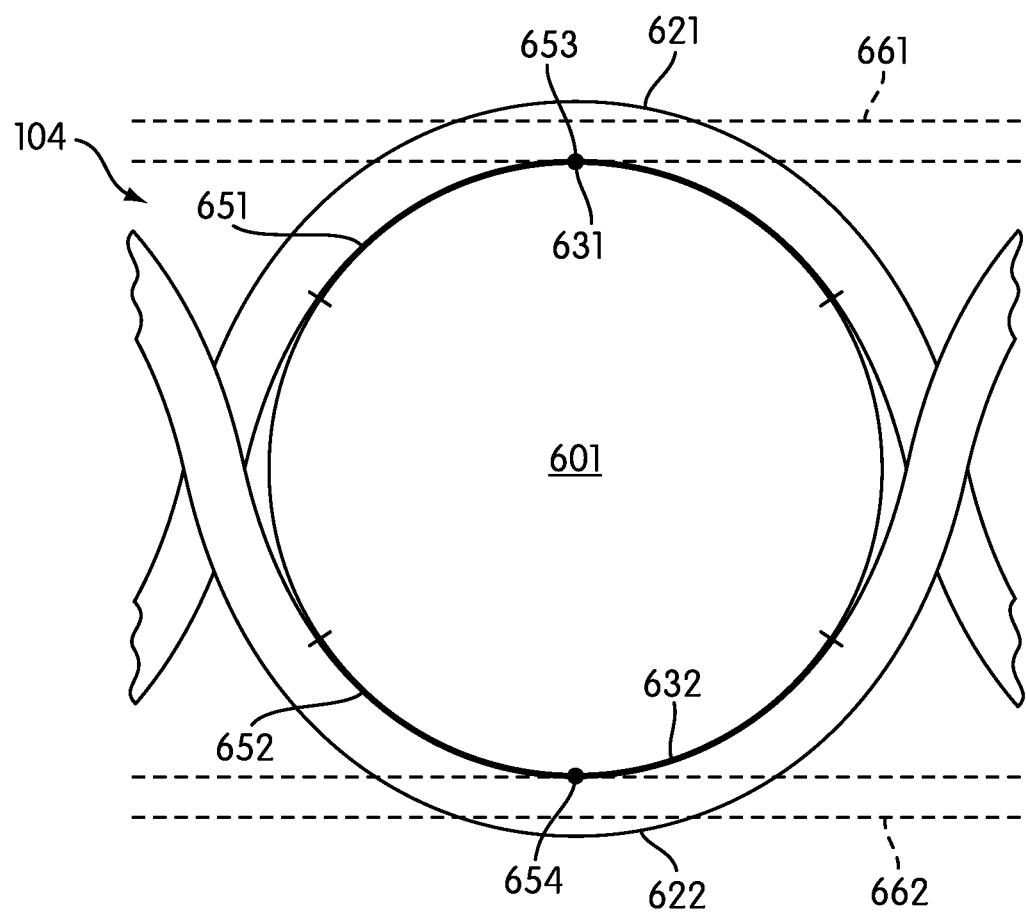
FIG. 9 is a cross sectional view of a portion of an exemplary embodiment of a single actuating fiber from a woven active fiber composite.

FIG. 9 illustrates a cross sectional view of an exemplary embodiment of a portion of a single actuating fiber from woven active fiber composite 100. In this embodiment, actuating fiber 601 includes first peripheral portion 631 and second peripheral portion 632.

In different embodiments, the size of first peripheral portion 631 and second peripheral portion 632 can vary. In some embodiments, first peripheral portion 631 and second peripheral portion 632 may each have a length that is greater than or equal to an eighth of the circumference of actuating fiber 601. In other embodiments, first peripheral portion 631 and second peripheral portion 632 may each have a length that is greater than or equal to a quarter of the circumference of actuating fiber 601. In still other embodiments, first peripheral portion 631 and second peripheral portion 632 may each have a length that is approximately one half of the circumference of actuating fiber 601. In other words, in some embodiments, first peripheral portion 631 and second peripheral portion 632 may comprise substantially the entirety of the circumference of actuating fiber 601.

First portion 621 of conductive wire electrode 611 may be configured to wrap around first peripheral portion 631 of actuating fiber 601. Likewise, second portion 622 of conductive wire electrode 611 may be configured to wrap around second peripheral portion 632 of actuating fiber 601. Since conductive wire electrode 611 is generally flexible, first portion 621 and second portion 622 may generally conform to the contours of first peripheral portion 631 and second peripheral portion 632, respectively.

Generally, the contact region between actuating fiber 601 and conductive wire electrode 611 may be increased using this woven arrangement. In this embodiment, first portion 621 and first peripheral portion 631 may coincide at first contact region 651. Also, second portion 622 and second peripheral portion 632 may coincide at second contact region 652. In an exemplary embodiment, first contact region 651 and second contact region 652 are associated with a substantial entirety of first peripheral portion 631 and second peripheral portion 632, respectively. In other words, first portion 621 and second portion 622 may be configured to cover a majority of the circumference of actuating fiber 601. In still other embodiments, first portion 621 and second portion 622 may be configured to cover a substantial entirety of the diameter of actuating fiber 601.

Since flat electrodes are typically associated with films and applied to an upper surface and/or lower surface of an active fiber composite, the electrodes may not be configured to conform to the curvature of the individual actuating fibers. This generally results in a reduced contact area. For purposes of comparison, contact regions between actuating fiber 601 and traditional flat electrodes are also shown in FIG. 9. In this case, first flat electrode 661 and second flat electrode 662 are illustrated in phantom. First flat electrode 661 may be configured to contact first peripheral portion 631 at third contact region 653. Also, second flat electrode 662 may be configured to contact second peripheral portion 632 at fourth contact region 654. As seen in FIG. 9, third contact region 653 and fourth contact region 654 are substantially point-like contact regions. Furthermore, first contact region 651 and second contact region 652 are substantially larger than third contact region 653 and fourth contact region 654. With this arrangement, woven active fiber composite 100 can be provided with increased actuation authority and efficiency over traditional active fiber composites that use substantially flat electrodes.

Figure 10:
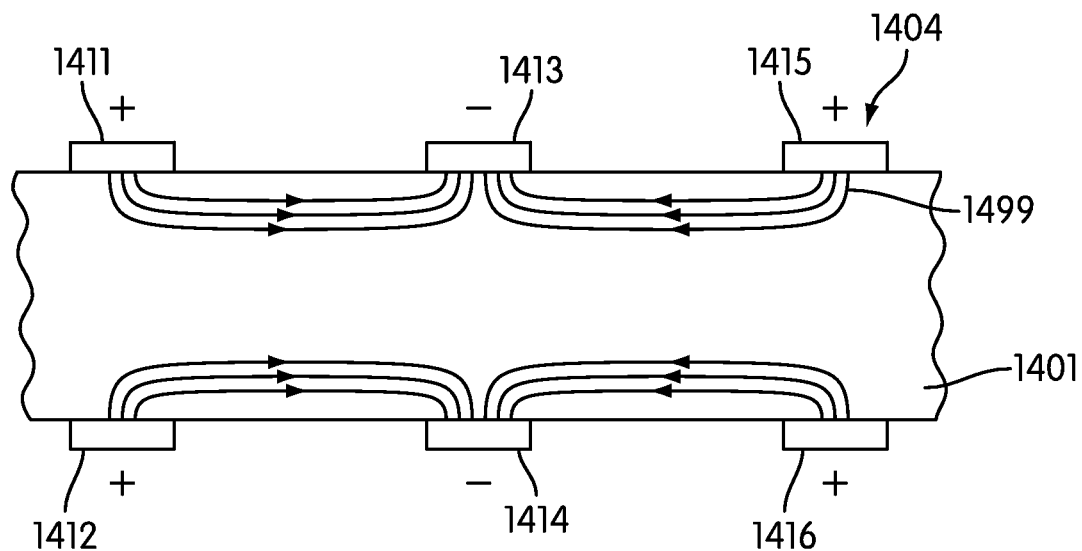
FIG. 10 is a cross sectional view of an exemplary embodiment of an electrical field within a single actuating fiber produced by flat electrodes.
Figure 11:
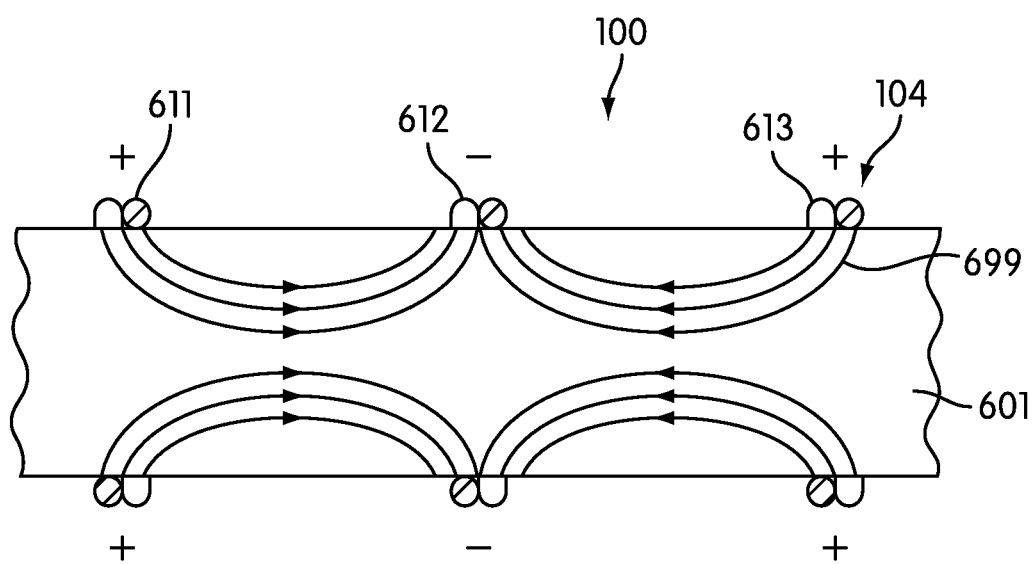
FIG. 11 is a cross sectional view of an exemplary embodiment of an electrical field within a single actuating fiber produced by woven conductive wire electrodes.

In some embodiments, woven active fiber composite 100 may have increased actuation authority and efficiency over traditional active fiber composites because of the different kinds of electrical fields produced by substantially flat electrodes and woven conductive wire electrodes. FIGS. 10 and 11 illustrate cross sectional views of exemplary embodiments of electric fields produced by substantially flat electrodes and woven conductive wire electrodes. FIG. 10 illustrates an exemplary embodiment of first electric field 1499 produced by substantially flat electrodes disposed on actuating fiber 1401 of a traditional active fiber composite. Similarly, FIG. 11 illustrates an exemplary embodiment of second electric field 699 produced by conductive wire electrodes 104 that are woven around actuating fiber 601 of active fiber composite 100. For purposes of comparison, actuating fiber 1401 and actuating fiber 601 may be substantially similar in size, shape and composition.

Referring to FIG. 10, first electric field 1499 is produced by plurality of flat electrodes 1404. In this exemplary embodiment, plurality of flat electrodes 1404 includes first flat electrode 1411, second flat electrode 1412, third flat electrode 1413, fourth flat electrode 1414, fifth flat electrode 1415 and sixth flat electrode 1416. In some cases, first flat electrode 1411, second flat electrode 1412, fifth flat electrode 1415 and sixth flat electrode 1416 may be positive electrodes. Likewise, third flat electrode 1413 and fourth flat electrode 1414 may be negative electrodes. Furthermore, plurality of flat electrodes 1404 may contact actuating fiber 1401 at substantially small contact regions.

In some cases, substantially small contact regions between plurality of flat electrodes 1404 and actuating fiber 1401 can produce highly concentrated electric fields. In one embodiment, first electric field 1499, as indicated by electric field lines, may be a highly concentrated electric field at the edges of plurality of flat electrodes 1404. These highly concentrated fields caused by first electric field 1499 may create regions of high localized stress within actuating fiber 1401. This configuration may cause actuating fiber 1401 to have higher fatigue failure rates. Furthermore, the actuation efficiency of actuating fiber 1401 may be decreased because of fracturing that can occur at the high electric field gradient regions produced by the reduced contact regions of plurality of flat electrodes 1404.

In contrast to substantially flat electrodes, conductive wire electrodes 104 may cover a majority of the circumference of actuating fiber 601, as previously discussed with respect to FIG. 9. Referring to FIG. 11, first conductive wire electrode 611, second conductive wire electrode 612 and third conductive wire electrode 613 of conductive wire electrodes 104 may cover a majority of the circumference of actuating fiber 601. Furthermore, first conductive wire electrode 611 and third conductive wire electrode 613 may be positive electrodes while second conductive wire electrode 612 may be a negative electrode. With this arrangement, first conductive wire electrode 611, second conductive wire electrode 612 and third conductive wire electrode 613 may produce second electric field 699 as indicated by electric field lines.

Due to the large contact regions between first conductive wire electrode 611, second conductive wire electrode 612 and third conductive wire electrode 613 and actuating fiber 601, second electric field 699 may penetrate through a substantial entirety of the diameter of actuating fiber 601. In contrast to the highly concentrated first electric field 1499 generated using plurality of flat electrodes 1404, second electric field 699 may be substantially uniform throughout actuating fiber 601.

As second electric field 699 penetrates a substantial entirety of a diameter of actuating fiber 601, second electric field 699 may increase the actuation efficiency of actuating fiber 601. In particular, actuating fiber 601 may achieve greater extension and contraction during actuation due to the increased penetration of second electric field 699. Furthermore, the uniformity of second electric field 699 may not produce high localized stresses within actuating fiber 601 that can cause structural damage to actuating fiber 601.

Generally, the size of a contact region between an actuating fiber and a woven conductive wire electrode can be varied by changing the diameters of the actuating fibers and/or the conductive wire electrodes as well as other features of the geometry. In some cases, the size of the contact region can be decreased. In other cases, the size of the contact region can be increased. In an exemplary embodiment, the size of the contact region can be increased to allow for near-continuous contact between the conductive wire electrode and the actuating fiber by virtue of the woven topology.

The current embodiments are intended to illustrate some of the benefits of using a woven topology and/or geometry for an active fiber composite. Current active fiber composite design has a minimum feature size that can be implemented robustly. Using the features discussed above allows smaller geometries of electrodes and fibers to be implemented. This further allows for smaller operating voltages, as well as reduced costs and complexity associated with high voltage circuits that are required for current active fiber composite designs. Conventional active fiber composites require several kilovolts for full operational range. In contrast, a woven active fiber composite may allow for a smaller operational range of approximately −600 volts to +600 volts.

Figure 12:
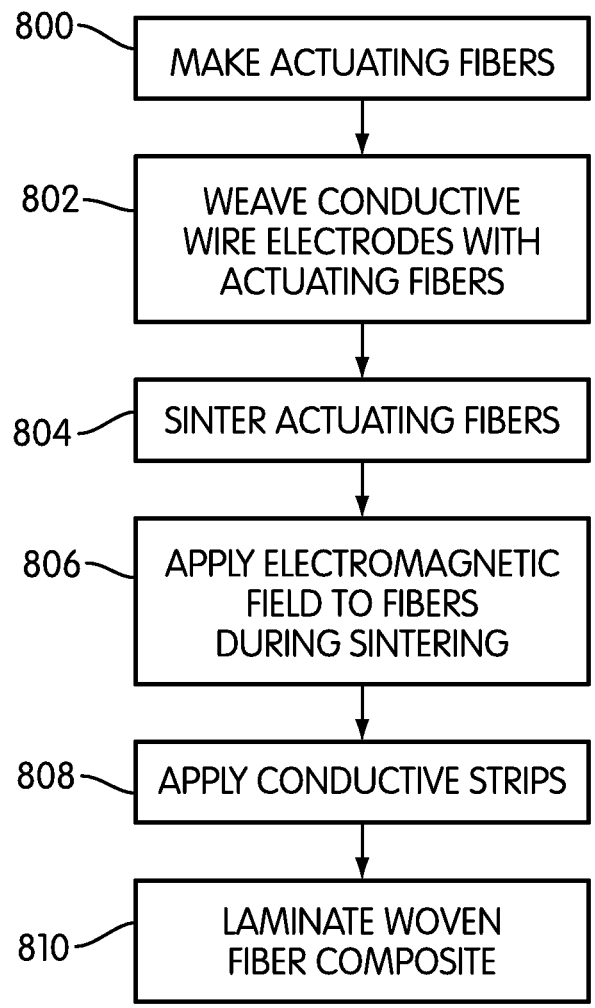
FIG. 12 is an exemplary embodiment of a general process for making a woven active fiber composite.

FIG. 12 is an exemplary embodiment of a general process for making a woven active fiber composite. In some embodiments, the following steps may be performed in a single manufacturing process. In other embodiments, one or more steps can be separated into different manufacturing processes performed at different manufacturing locations. It will be understood that in some cases, the one or more of the following steps may be optional. In addition, in other cases, the order of steps may be changed.

During first step 800, a manufacturer may make a plurality of actuating fibers. In this exemplary embodiment, the actuating fibers are PZT fibers, as previously discussed. Processes for making PZT fibers are known in the art. Generally, the process of making PZT fibers includes mixing PZT powder with a precursor or binder, followed by a known process for extruding the fiber. Examples of mixing and/or extruding processes include, but are not limited to VPP, VSSP, sol-gel, as well as other mixing and/or extruding processes. At this point, the PZT fiber is dried and cut. In some cases, following the drying and cutting of the fibers, the fibers may undergo binder burnout.

Following first step 800, during second step 802, the actuating fibers may be woven with conductive wire electrodes. In some embodiments, the actuating fibers may be applied to a loom and woven in a manner similar to the weaving of traditional textile materials. In other embodiments, the actuating fibers may be woven with the conductive wire electrodes by hand. In still other embodiments, the actuating fibers may be woven with the conductive wire electrodes using another method. In an exemplary embodiment, the actuating fibers are arranged in a generally parallel direction while conductive wire electrodes are woven through the actuating fibers in an alternating fashion. Furthermore, the conductive wire electrodes are woven through the actuating fibers in a manner that yields an interdigitated arrangement discussed above.

During third step 804, the woven active fiber composite comprising interwoven actuating fibers and conductive wire electrodes undergoes a sintering process. Generally, the woven active fiber composite may be heated during the sintering process. In an exemplary embodiment, the woven active fiber composite is heated to a temperature in the range between 1000 and 1400 degrees Celsius. Using this sintering process, PZT precursors may form grains of individual piezoactive domains that comprise an actuating fiber.

Traditionally, actuating fibers, such as PZT fibers, may be sintered prior to combining the actuating fibers with electrodes. In this exemplary process, the actuating fibers are sintered following the weaving of the actuating fibers with the conductive wire electrodes. Because both the actuating fibers and the conductive wire electrodes are heated to a high temperature during the sintering process, an electromagnetic field can also be applied substantially simultaneously to sintering in order to pole the actuating fibers.

During fourth step 806, which can occur substantially simultaneously with third step 804, an electric and/or magnetic field can be applied to the woven active fiber composite. In some cases, a time varying, or AC, electromagnetic field can be used. In other cases, a DC, or quasi-static, electric field can be used. In one embodiment, as the temperature of the woven fiber composite is lowered at the end of the sintering process, a quasi-static electric field can be applied to the negative and positive electrodes. This arrangement allows the actuating fibers to be poled as the actuating fibers cool below the curie temperature.

By combining manufacturing steps, the extra step of reheating before poling can be removed. Instead, the actuating fibers can be poled during the first heating of the woven active fiber composite that occurs during the sintering process. Furthermore, poling can be performed prior to lamination. In contrast, previous methods required laminating the active fiber composite prior to poling. This exemplary process allows the woven active fiber composite to be assembled without introducing extra stresses on the composite once the composite is impregnated with an epoxy matrix. Furthermore, by poling the fibers during cooling from sintering, the woven active fiber composite will only be subjected to minimal temperature excursions once integrated into the epoxy matrix. By limiting the exposure to temperature extremes, the resultant woven active fiber composite will have improved robustness and actuation authority over an extended lifetime.

Following fourth step 806, conductive strips may be associated with the open ends of the conductive wire electrodes during fifth step 808. In some cases, the conductive strips could be applied prior to sintering and poling. In an exemplary embodiment, the conductive strips may be applied following sintering and poling. Finally, during sixth step 810, a woven active fiber composite can be laminated. In some embodiments, an epoxy matrix can be applied to the woven active fiber composite, including the actuating fibers, the conductive wire electrodes and the conductive strips. With this arrangement, the epoxy matrix can provide electrical insulation, as well as mechanical rigidity for good load transfer.

FIGS. 13-16 are intended to illustrate exemplary embodiments of some steps for manufacturing a woven active fiber composite. It should be understood that the following embodiments are only intended to be exemplary. Furthermore, the order of steps can be modified in some cases.

Figure 13:
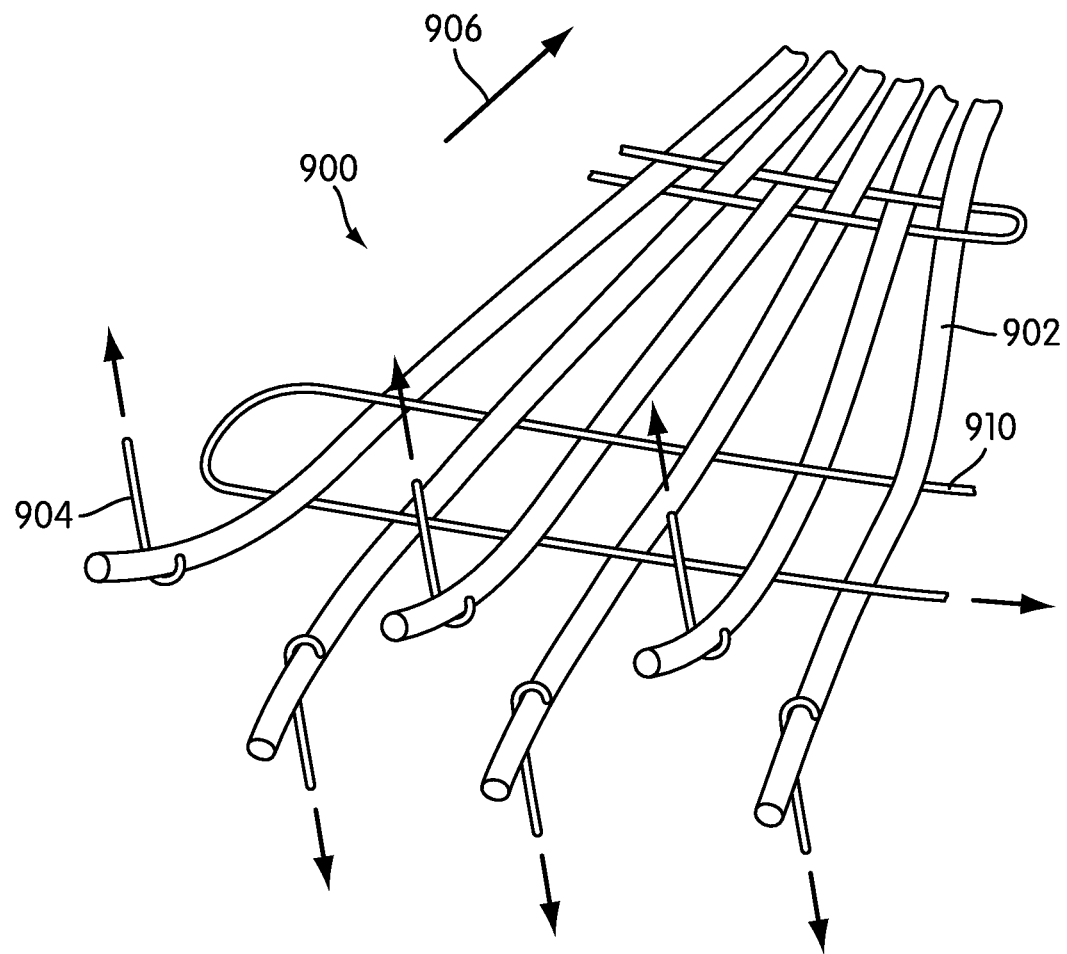
FIG. 13 is an exemplary embodiment of a process for weaving actuating fibers and conductive wire electrodes to create a woven active fiber composite.

FIG. 13 illustrates an exemplary embodiment of a process for weaving actuating fibers and conductive wire electrodes to create a woven active fiber composite. In this exemplary embodiment, the woven active fiber composite may be made using a traditional loom weaving system. In other embodiments, however, the weaving of actuating fibers with conductive wire electrodes may be achieved using other known weaving methods. Additionally, it should be understood that any type of woven structure may be utilized in combing the actuating fibers with the conducting wire electrodes.

Examples of various weave types include, but are not limited to, plain weaves, twill weaves, satin weaves, basket weaves as well as other types of weaves.

Referring to FIG. 13, actuating fibers 902 may be placed onto a loom (not shown). In some cases, actuating fibers 902 may be sintered. In other embodiments, actuating fibers 902 may not be sintered. In this exemplary embodiment, sintering may be done after actuating fibers 902 are woven with conductive wire electrodes 910.

In some embodiments, actuating fibers 902 may be spooled through spinnerets 904 of the loom, moving actuating fibers 902 in a rear direction 906. Generally, actuating fibers 902 are aligned side by side in a parallel direction. As actuating fibers 902 are pulled through the loom, spinnerets 904 may move in an alternating fashion that pulls adjacent actuating fibers 902 in alternating directions. In some cases, conductive wire electrodes 910 are fed between the alternating actuating fibers 902. As actuating fibers 902 are pulled in tension by spinnerets 904, conductive wire electrodes 910 are pressed into a weave around the larger actuating fibers 902.

This looming process can continue until the desired length of woven active fiber composite 900 is achieved. In particular, as actuating fibers 902 are fed through the loom additional conductive wire electrodes 910 may be added at substantially regular intervals. Since conductive wire electrodes 910 may be woven through actuating fibers 902 one at a time, changes in size and/or shape of woven active fiber composite 900 can be made with minimal setup changes to the manufacturing process.

Figure 14:
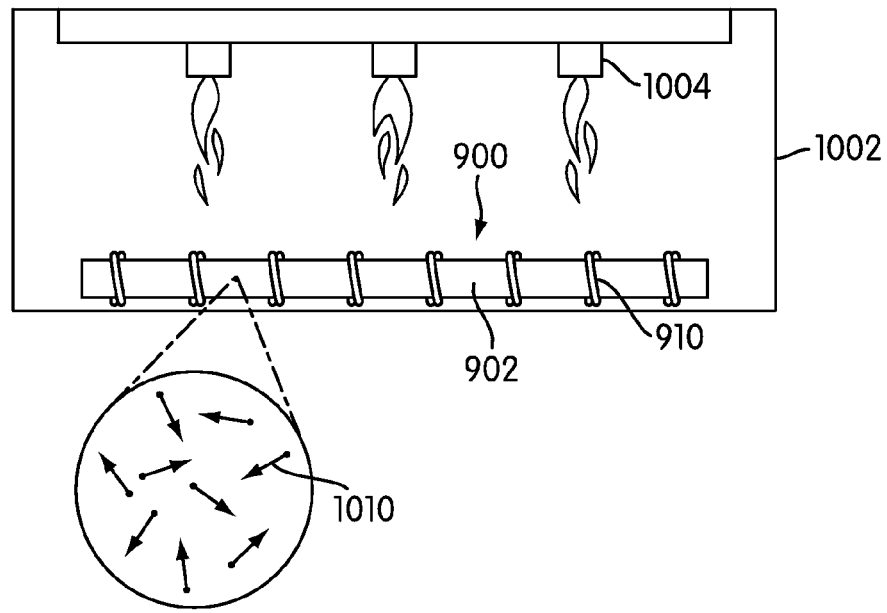
FIG. 14 is an exemplary embodiment of sintering and poling a woven active fiber composite for manufacturing a woven active fiber composite.
Figure 15:
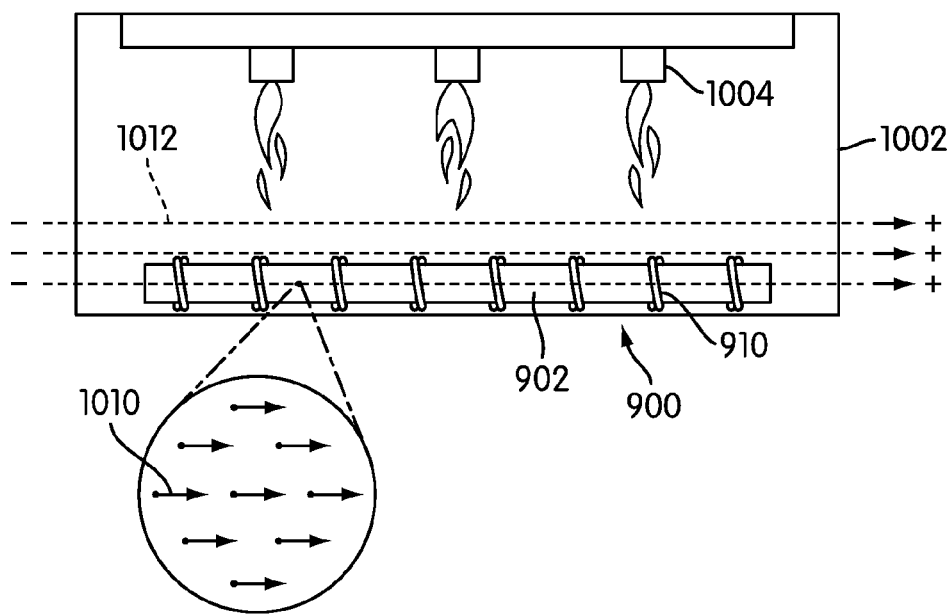
FIG. 15 is an exemplary embodiment of sintering and poling a woven active fiber composite for manufacturing a woven active fiber composite.

FIGS. 14 and 15 illustrate an exemplary embodiment of the steps of sintering woven active fiber composite 900 and poling woven active fiber composite 900. In some cases, these steps may be performed substantially simultaneously. In other cases, these steps may be performed independently of one another. In this exemplary embodiment, a poling field is applied to woven active fiber composite 900 during the sintering process.

Referring to FIG. 14, woven active fiber composite 900 may be disposed in oven 1002. Generally, oven 1002 may be any device capable of heating woven active fiber composite 900. In particular, oven 1002 may include heat sources 1004. As previously discussed, oven 1002 may be configured to heat woven active fiber composite 900 to a temperature of approximately 1000 to 1400 degrees Celsius to sinter actuating fibers 902 of woven active fiber composite 900.

As seen in FIG. 14, initially, actuating fibers 902 may be associated with piezoelectric crystals having generally randomly oriented dipole moments 1010. Referring to FIG. 15, as actuating fibers 902 are sintered, electromagnetic field 1012 may be applied in the vicinity of woven active fiber composite 900. At this point, a desired crystallographic order may be imposed on the developing PZT grains of actuating fibers 902. In the current embodiment, the desired crystallographic order is indicated schematically as an alignment of dipole moments 1010 of the piezoelectric crystals. However, the orientation of dipole moments 1010 could be different in other embodiments. For example, in some cases, dipole moments 1010 could be aligned in a generally axial direction. Using this method of developing crystallographic order for the crystals of actuating fibers 902 can provide increased numbers of 180 degree domains and increased d33 actuation. Furthermore, an increased degree of control could be exerted on the sintering process, allowing for tailoring the effects of domain twinning. In some cases, increase control over the plasticity of potential energy storage may be achieved by manipulating the spring constant of torsional lamination applications. In still other cases, by applying AC fields to the woven conductive wire electrodes 910, it may be possible to provide a high degree of control over grain size, in addition to crystallographic orientation and/or phase.

Figure 16:
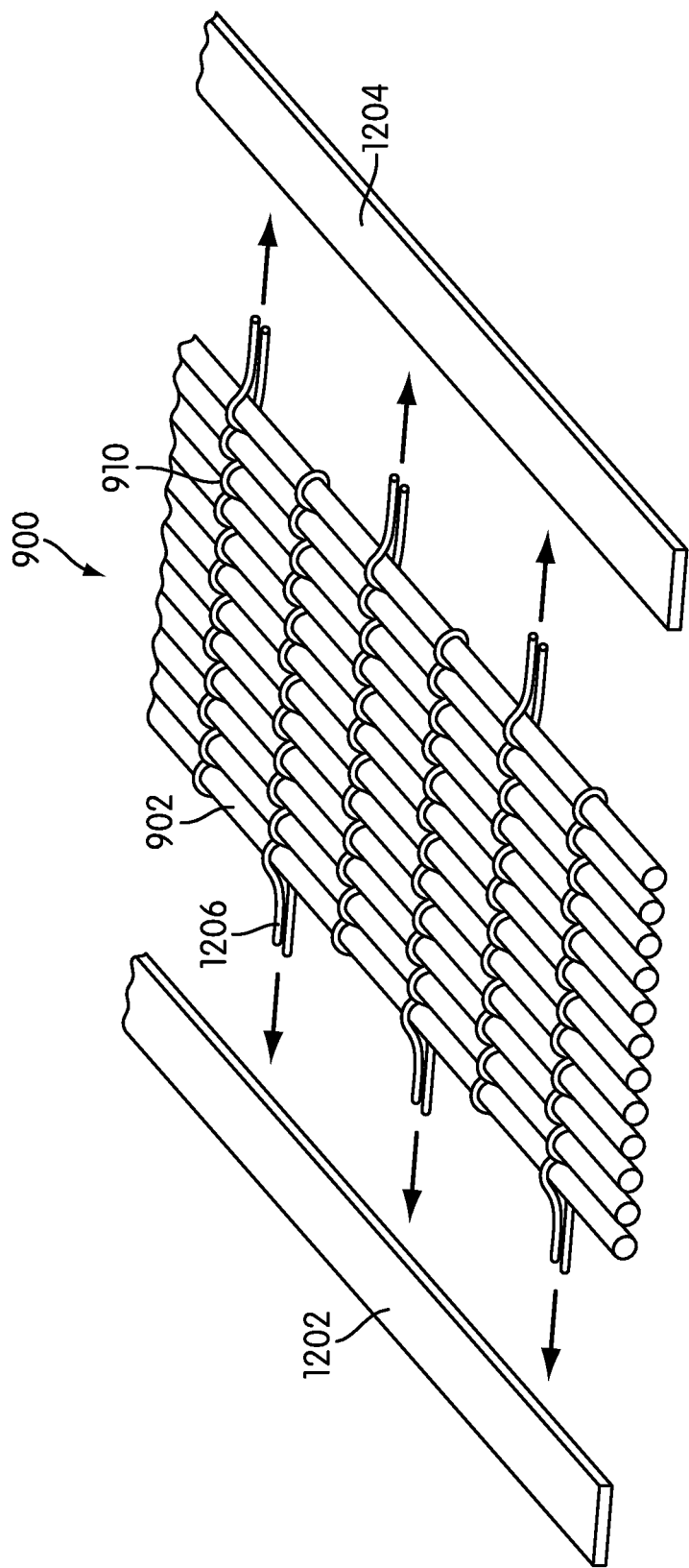
FIG. 16 is an exemplary embodiment of attaching conductive strips to a woven active fiber composite.

Referring to FIG. 16, following sintering and poling, one or more conductive strips may be applied to woven active fiber composite 900. In this embodiment, first conductive strip 1202 and second conductive strip 1204 can be associated with lateral portions of woven active fiber composite 900. In particular, ends of first electrode set 1206 of conductive wire electrodes 910 may be attached to first conductive strip 1202. Likewise, ends of second electrode set 1208 may be attached to second conductive strip 1204.

Generally, conductive strips can be attached with ends of conductive wire electrodes in any manner known in the art. In some cases, the ends of conductive wire electrodes could be soldered with the conductive strips. In other cases, the ends of the conductive wire electrodes could be wrapped around a portion of the conductive strips to form an electrical connection. In still other embodiments, a conductive strip could include electrical terminals to receive the ends of conductive wire electrodes.

Figure 17:
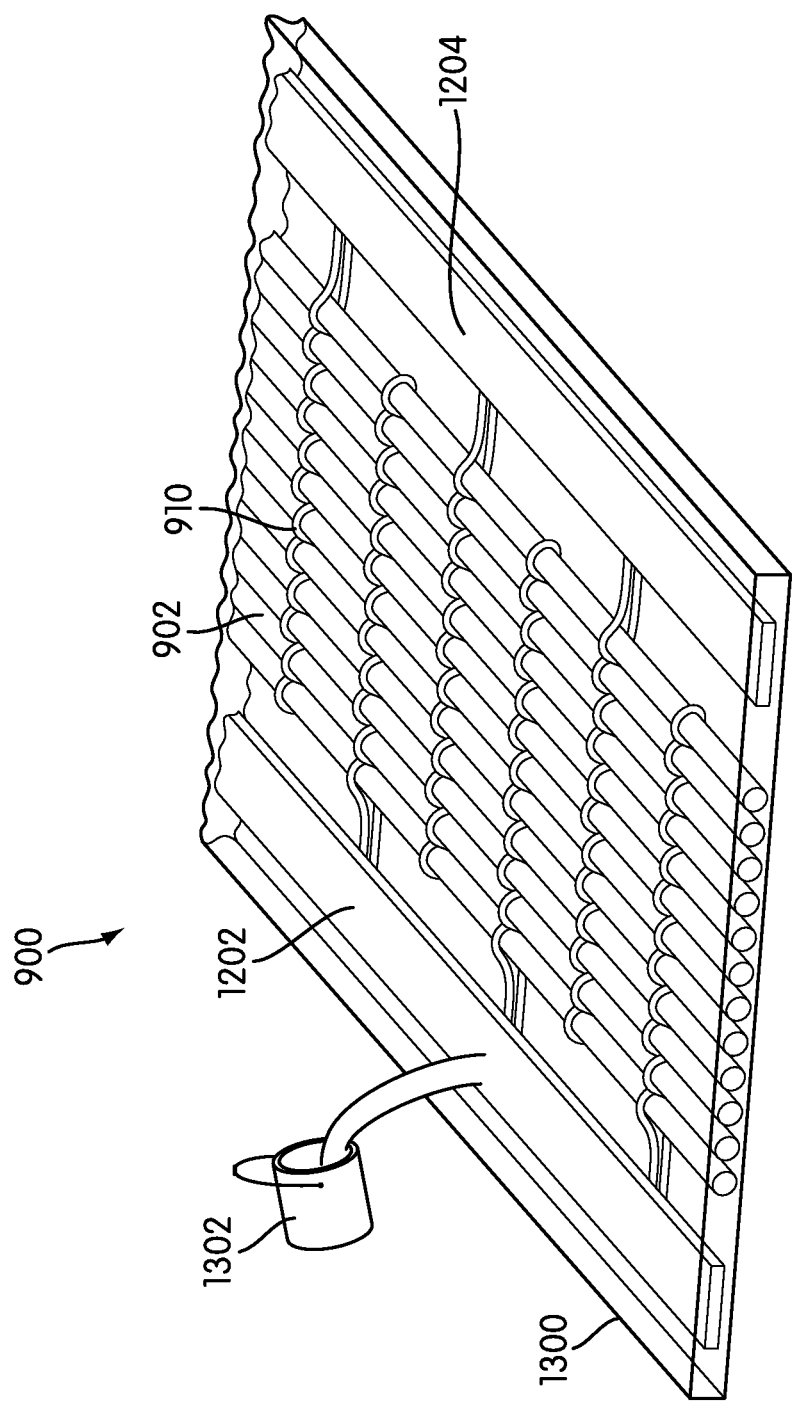
FIG. 17 is a schematic illustration of an exemplary embodiment of a step of laminating a woven active fiber composite.

FIG. 17 is a schematic illustration of an exemplary embodiment of a step of laminating woven active fiber composite 900. In this embodiment, epoxy 1300 is applied using epoxy source 1302. In some cases, epoxy 1300 may be poured over woven active fiber composite 900. In particular, woven active fiber composite 900 could be placed in a mold configured with a desired shape for epoxy 1300. As illustrated in FIG. 17, epoxy 1300 is configured to cover actuating fibers 902, conductive wire electrodes 910, as well as first conductive strip 1202 and second conductive strip 1204. This laminated arrangement for woven active fiber composite 900 increases the load bearing characteristics of woven active fiber composite 900. Furthermore, this arrangement can help protect actuating fibers 902 and conductive wire electrodes 910 from the environment to help preserve the structural integrity of woven active fiber composite 900.

A woven active fiber composite may include additional provisions to strengthen the woven active fiber composite. In some embodiments, a woven active fiber composite may include filler fibers to add structural strength to the woven active fiber composite. In some embodiments, filler fibers may be disposed between adjacent pairs of conductive wire electrodes. In some cases, filler fibers may be woven through actuating fibers of a woven active fiber composite. With this arrangement, the filler fibers may strengthen the woven active fiber composite and also assist in maintaining the desired spacing between adjacent pairs of conductive wire electrodes as well as actuating fibers.

Figure 18:
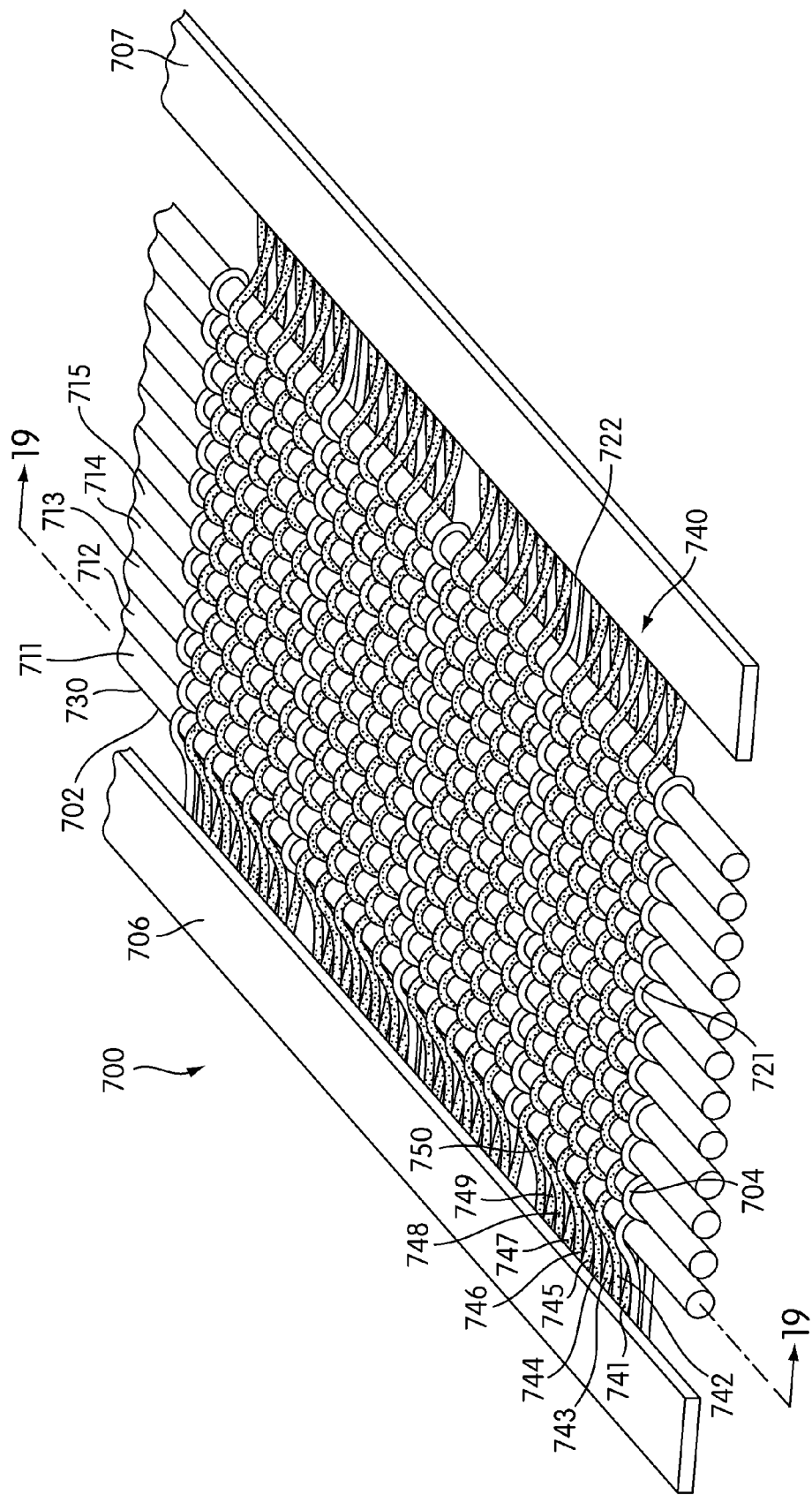
FIG. 18 is a schematic isometric view of an exemplary embodiment of filler fibers woven around actuating fibers of a woven active fiber composite.
Figure 19:
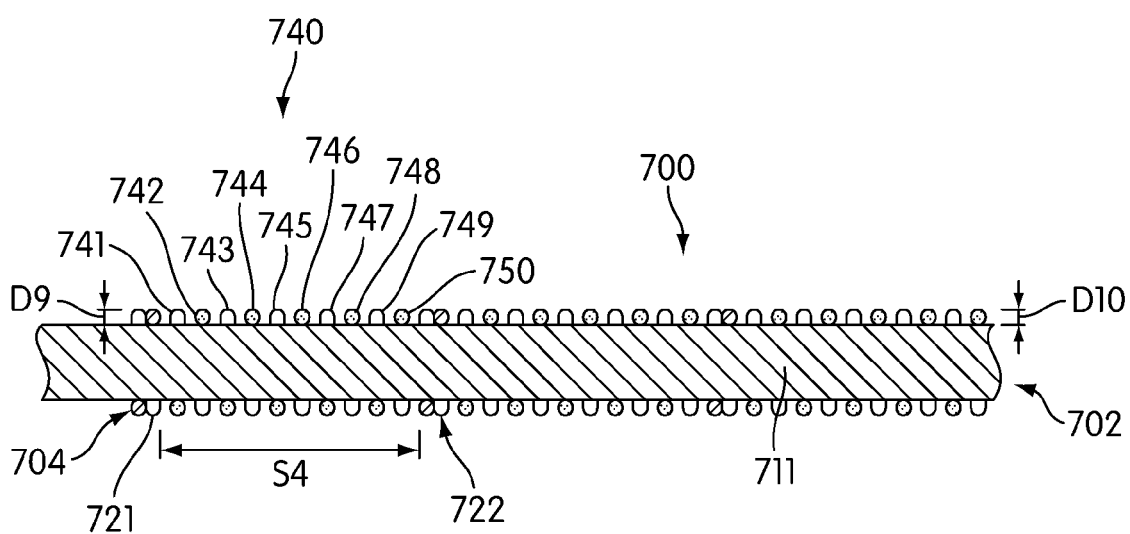
FIG. 19 is a cross sectional view of an exemplary embodiment of a woven active fiber composite with filler fibers.

FIGS. 18 and 19 illustrate schematic views of an exemplary embodiment of woven active fiber composite 700 with a plurality of filler fibers 740. In particular, FIG. 18 is an isometric view of an exemplary embodiment of woven active fiber composite 700 and FIG. 19 is a cross sectional view of an exemplary embodiment of woven active fiber composite 700. For purposes of clarity, only a portion of woven active fiber composite 700 is illustrated in FIG. 18.

In an exemplary embodiment, woven active fiber composite 700 includes a plurality of actuating fibers 702. Plurality of actuating fibers 702 may include any number of actuating fibers. In some cases, plurality of actuating fibers 702 can include twelve actuating fibers. Furthermore, plurality of actuating fibers 702 can be arranged in any orientation. In this exemplary embodiment, each of the fibers of plurality of actuating fibers 702 are oriented in a generally parallel manner.

Also, woven active fiber composite 700 includes a plurality of conductive wire electrodes 704. For purposes of clarity, only five conductive wire electrodes are shown in this embodiment. In one embodiment, conductive wire electrodes 704 may be woven in a generally plain weave pattern through actuating fibers 702 in a manner substantially similar to a previous embodiment illustrated in FIGS. 1-4. In other cases, conductive wire electrodes 704 may be woven in a different manner through actuating fibers 702.

Generally, filler fibers associated with a woven active fiber composite may be electrical insulators. For example, in some embodiments, filler fibers may be constructed from fiber glass, including, but not limited to, S-glass and E-glass. In other embodiments, filler fibers may be constructed from another electrically insulating material that can withstand sintering temperatures between 1000 and 1500 degrees Celsius.

In different embodiments, a woven active fiber composite may include varying numbers of filler fibers. In some embodiments, varying numbers of filler fibers may be disposed between adjacent pairs of conductive wire electrodes. In other embodiments, a constant number of filler fibers may be disposed between adjacent pairs of conductive wire electrodes.

In one embodiment, woven active fiber composite 700 may be configured with ten filler fibers disposed between adjacent pairs of conductive wire electrodes 704. For example, first filler fiber 741, second filler fiber 742, third filler fiber 743, fourth filler fiber 744, fifth filler fiber 745, sixth filler fiber 746, seventh filler fiber 747, eighth filler fiber 748, ninth filler fiber 749 and tenth filler fiber 750 of filler fibers 740 may be disposed between first conductive wire electrode 721 and second conductive wire electrode 722. Similarly, ten filler fibers may be disposed between each of the remaining adjacent pairs of conductive wire electrodes 704.

In some embodiments, filler fibers 740 may be woven through actuating fibers 702. Generally, filler fibers 740 may be woven through actuating fibers 702 in any manner known in the art including the manners discussed in previous embodiments for weaving conductive wire electrodes. In some embodiments, filler fibers 740 may be woven in a first lateral direction through actuating fibers 702, wrapped around a lateral portion of woven active fiber composite 700 and then re-woven through actuating fibers 702 in a second lateral direction that is opposite to the first lateral direction. In an exemplary embodiment, filler fibers 740 may be woven through actuating fibers 702 in a first lateral direction without being re-woven through actuating fibers in a second lateral direction.

In one embodiment, filler fibers 740 may extend from first conductive strip 706 of woven active fiber composite 700 and filler fibers 740 may be woven in a generally plain weave pattern in one lateral direction through actuating fibers 702. For example, referring to FIG. 18, first filler fiber 741 may be woven under first actuating fiber 711, over second actuating fiber 712, under third actuating fiber 713, over fourth actuating fiber 714 and under fifth actuating fiber 715. Furthermore, first filler fiber 741 may be woven through the remaining fibers of actuating fibers 702 in a similar manner. Likewise, second filler fiber 742 may be woven over first actuating fiber 711, under second actuating fiber 712, over third actuating fiber 713, under fourth actuating fiber 714 and over fifth actuating fiber 715. Furthermore, second filler fiber 742 may be woven through the remaining fibers of actuating fibers 702 in a similar manner. Additionally, the remaining filler fibers of filler fibers 740 may be woven through actuating fibers 702 in a similar manner to first filler fiber 741 and second filler fiber 742. After weaving through actuating fibers 702, filler fibers 740 may be attached to second conductive strip 707 of woven active fiber composite 700, in any manner known in the art.

In some cases, the weaving of filler fibers 740 can increase the structural strength of woven active fiber composite 700. In particular, filler fibers 740 can reduce the potential of buckling between conductive wire electrodes 704 for actuating fibers 702. With this configuration, filler fibers 740 can help maintain the alignment of actuating fibers 702 in the axial direction.

In addition, the weaving of filler fibers 740 may also assist in maintaining the lateral spacing between adjacent actuating fibers 702, as illustrated in FIGS. 18 and 19. In embodiments where actuating fibers 702 have a constant diameter, the weaving of filler fibers 740 may space apart adjacent actuating fibers 702 in a lateral direction. In embodiments where actuating fibers 702 have periodically varying diameters, the weaving of filler fibers 740 can help maintain the general parallel arrangement between adjacent actuating fibers 702.

In different embodiments, the shape of filler fibers 740 can vary. In some embodiments, filler fibers 740 can have any cross sectional shape that has been previously discussed for actuating fibers 102 of a previous embodiment illustrated in FIGS. 1-4. In some embodiments, filler fibers 740 and conductive wire electrodes 704 may have different cross sectional shapes. In other embodiments, filler fibers 740 and conductive wire electrodes 704 may have substantially similar cross sectional shapes. Referring to FIG. 19, filler fibers 740 and conductive wire electrodes 704 are configured with generally circular cross sectional shapes.

In an exemplary embodiment, conductive wire electrodes 704 may be associated with diameter D9. Similarly, filler fibers 740 may be associated with diameter D10. In some cases, diameter D1 may be smaller than diameter D9. In other cases, diameter D10 may be larger than diameter D9. In one embodiment, diameter D9 of conductive wire electrodes 704 may be substantially similar to diameter D1 of filler fibers 740. With substantially similar diameters and cross sectional shapes, conductive wire electrodes 704 and filler fibers 740 may present a generally flat outer surface for woven active fiber composite 700.

In embodiments where actuating fibers 702 include recessed portions to receive conductive wire electrodes 702, actuating fibers 702 may also include recessed portions to receive filler fibers 740. This arrangement allows conductive wire electrodes 704 and filler fibers 740 to form a substantially flat outer surface for woven active fiber composite 700. With a substantially flat outer surface, a more uniform transmission of load can be achieved throughout woven active fiber composite 700.

By weaving filler fibers 740 between adjacent pairs of conductive wire electrodes 704, filler fibers 740 may assist in maintaining the desired spacing between pairs of adjacent conductive wire electrodes 704. Referring to FIG. 19, first conductive wire electrode 721 is spaced apart from second conductive wire electrode 722 by spacing S4. With filler fibers 740 disposed between first conductive wire electrode 721 and second conductive wire electrode 722, filler fibers 740 may help maintain the desired spacing S4 between first conductive wire electrode 721 and second conductive wire electrode 722.

Conductive wire electrodes of a woven active fiber composite may be woven around actuating fibers to expose greater portions of actuating fibers to the conductive wire electrodes. In other words, conductive wire electrodes may be woven around actuating fibers to reduce the dead space of actuating fibers or the portions of actuating fibers that are not exposed to an electrical field. In one exemplary embodiment, conductive wire electrodes may weave helically around actuating fibers to reduce the dead space of the actuating fibers. This configuration can improve the actuation efficiency of a woven active fiber composite by exposing greater portions of actuating fibers to conductive wire electrodes.

FIG. 20 is an isometric view of an exemplary embodiment of a conductive wire electrode woven around a plurality of actuating fibers 2002 of a portion of woven active fiber composite 2000. For purposes of clarity, only a portion of woven active fiber composite 2000 is illustrated in FIG. 20. In particular, first end portion 2051 of woven active fiber composite 2000 is illustrated, but not a second end portion, disposed opposite first end portion 2051.

In an exemplary embodiment, actuating fibers 2002 include first actuating fiber 2011, second actuating fiber 2012, third actuating fiber 2013, fourth actuating fiber 2014, as well as additional actuating fibers. Actuating fibers 2002 may be disposed adjacent to one another in a generally lateral direction.

In one embodiment, woven active fiber composite 2000 includes conductive wire electrode 2004. Conductive wire electrode 2004 may be associated with first conductive strip 2006 of woven active fiber composite 2000. In addition, conductive wire electrode 2004 includes first portion 2021 and second portion 2022. In some cases, first portion 2021 may be woven in a first lateral direction through actuating fibers 2002 in an alternating manner. After wrapping around a lateral portion of actuating fibers 2002, second portion 2022 may be woven in a second lateral direction through actuating fibers 2002 in an alternating manner.

As first portion 2021 and second portion 2022 are woven through actuating fibers 2002, first portion 2021 and second portion 2022 may wind helically in an axial direction around actuating fibers 2002. In other words, first portion 2021 and second portion 2022 may cross one another at multiple points along actuating fibers 2002.

In this exemplary embodiment, first portion 2021 may be woven in a helical manner over first actuating fiber 2011. In particular, first portion 2021 may wind helically toward first end portion 2051 of woven active fiber composite 2000 as first portion 2021 is woven over first actuating fiber 2011. Following the weaving over first actuating fiber 2011, first portion 2021 may be woven under second actuating fiber 2012. As first portion 2021 is woven under second actuating fiber 2012, first portion 2021 may wind in a helical manner away from first end portion 2051. Then, first portion 2021 may be woven over third actuating fiber 2013 in a helical manner toward first end portion 2051. After weaving over third actuating fiber 2013, first portion 2021 may weave in a helical manner away from first end portion 2051 under fourth actuating fiber 2014. In a substantially similar manner, first portion 2021 may weave through the remaining actuating fibers of actuating fibers 2002.

After reaching a lateral portion of actuating fibers 2002, second portion 2022 of conductive wire electrode 2004 may wrap around the lateral portion and be re-woven in a second lateral direction through actuating fibers 2002. In some cases, second portion 2022 may be re-woven through actuating fibers 2002 in helical manner. For example, second portion 2022 may be woven over fourth actuating fiber 2014 and wind helically away from first end portion 2051. Likewise, second portion 2022 may be woven under third actuating fiber 2013 and wind helically toward first end portion 2051. Following weaving under third actuating fiber 2013, second portion 2022 may be woven over second actuating fiber 2012 and wind helically away from first end portion 2051. Finally, second portion 2022 may then wind helically toward first end portion 2051 as second portion 2022 is woven under first actuating fiber 2011.

In some cases, as first portion 2021 and second portion 2022 are wound around actuating fibers 2002, first section 2071 of first portion 2021 may be disposed over second section 2072 of second portion 2022 at first actuating fiber 2011. In other words, first section 2071 and second section 2072 may be in the same plane with a central axis of first actuating fiber 2011. In a similar manner, sections of first portion 2021 and second portion 2022 may also be co-planar with central axes of the remaining fibers of actuating fibers 2002.

By weaving helically around actuating fibers 2002, first portion 2021 and second portion 2022 may be woven in a manner substantially similar to a double helix. It is also possible that in other embodiments conductive wire electrode 2004 may be wound through actuating fibers 2002 in a different manner. Although FIG. 20 illustrates the weaving of a single conductive wire electrode, it should be understood that additional conductive wire electrodes may be woven in a substantially similar manner around actuating fibers 2002. By winding helically around actuating fibers 2002, conductive wire electrode 2004 may reduce the dead space of actuating fibers 2002. With less dead space, the actuation efficiency of actuating fibers 2002 may be increased.

While various embodiments of the invention have been described, the description is intended to be exemplary, rather than limiting and it will be apparent to those of ordinary skill in the art that many more embodiments and implementations are possible that are within the scope of the invention. Accordingly, the invention is not to be restricted except in light of the attached claims and their equivalents. Also, various modifications and changes may be made within the scope of the attached claims.

What is claimed is:

1. A woven active fiber composite, comprising:
   a plurality of piezoelectric fibers that have been poled by applying an electromagnetic field; and
   a plurality of conductive wire electrodes configured to transfer electrical energy to and from the actuating fibers;
   wherein the plurality of conductive wire electrodes comprise a first electrode set and a second electrode set and are interwoven with the plurality of piezoelectric fibers, and
   wherein the conductive wire electrodes have an electric conductivity that is greater than the electric conductivity of the piezoelectric fibers, and
   wherein the interwoven conductive wire electrodes and piezoelectric fibers are configured to maintain a piezoelectric potential axially along the piezoelectric fibers between the first electrode set and the second electrode set, and
   wherein at least one positive conductive strip is attached to ends of the first electrode set and at least one negative conductive strip is attached to ends of the second electrode set.

2. The woven active fiber composite according to claim 1, wherein the piezoelectric fibers comprise PZT.

3. The woven active fiber composite according to claim 1, wherein a diameter of the plurality of piezoelectric fibers is in a range between 50 and 150 micrometers.

4. The woven active fiber composite according to claim 1, wherein a diameter of the plurality of conductive wire electrodes is in a range between 5 and 25 micrometers.

5. The woven active fiber composite according to claim 1, further comprising an epoxy matrix applied to the interwoven conductive wire electrodes and piezoelectric fibers and to the conductive strips.

6. The woven active fiber composite according to claim 1, wherein the plurality of piezoelectric fibers have been sintered after they have been woven with the plurality of conductive wire electrodes.

7. The woven active fiber composite according to claim 1, wherein the first electrode set is interdigitated with the second electrode set.

8. The woven active fiber composite according to claim 1, wherein the plurality of conductive wire electrodes has a substantially sinusoidal shape.

9. A woven active fiber composite, comprising:
a plurality of piezoelectric fibers that have been poled by applying an electromagnetic field and are arranged in a generally parallel direction;
a plurality of conductive wire electrodes comprising a first electrode set and a second electrode set configured to transfer electrical energy to and from the plurality of piezoelectric fibers; and
wherein a portion of the plurality of conductive wire electrodes is disposed between any two adjacent piezoelectric fibers, and
wherein the conductive wire electrodes have an electric conductivity that is greater than the electric conductivity of the piezoelectric fibers, and
wherein the interwoven conductive wire electrodes and piezoelectric fibers are configured to maintain a piezoelectric potential axially along the piezoelectric fibers between the first electrode set and the second electrode set, and
wherein at least one positive conductive strip is attached to ends of the first electrode set and at least one negative conductive strip is attached to ends of the second electrode set.

10. The woven active fiber composite according to claim 9, further comprising an epoxy matrix applied to the interwoven conductive wire electrodes and piezoelectric fibers and to the conductive strips.

11. The woven active fiber composite according to claim 9, wherein the spacing between any two adjacent piezoelectric fibers may change during actuation of the woven active fiber composite in the axial direction.

12. A woven active fiber composite, comprising:
a plurality of piezoelectric fibers that have been poled by applying an electromagnetic field and are arranged in a generally parallel direction; and
a plurality of conductive wire electrodes comprising a first electrode set and a second electrode set configured to transfer electrical energy to and from the plurality of piezoelectric fibers;
wherein substantially any two adjacent piezoelectric fibers are spaced apart fibers, and
wherein the conductive wire electrodes have an electric conductivity that is greater than the electric conductivity of the piezoelectric fibers, and
wherein the interwoven conductive wire electrodes and piezoelectric fibers are configured to maintain a piezoelectric potential axially along the piezoelectric fibers between the first electrode set and the second electrode set, and
wherein at least one positive conductive strip is attached to ends of the first electrode set and at least one negative conductive strip is attached to ends of the second electrode set.

13. The woven active fiber composite according to claim 12, further comprising an epoxy matrix applied to the interwoven conductive wire electrodes and piezoelectric fibers and to the conductive strips.

14. A woven active fiber composite, comprising:
a plurality of piezoelectric fibers that have been poled by applying an electromagnetic field, each fiber including a curved peripheral portion;
conductive wire electrodes comprising a first electrode set and a second electrode set configured to transfer electrical energy to and from the actuating fiber; and
wherein the conductive wire electrodes are configured to contact the piezoelectric fibers over the substantial entirety of their curved peripheral portions, and
wherein the conductive wire electrodes have an electric conductivity that is greater than their electric conductivity of the piezoelectric fibers, and
wherein the first electrode set and the second electrode set and the piezoelectric fibers are configured to maintain a piezoelectric potential axially along the piezoelectric fibers between the first electrode set and the second electrode set, and
wherein at least one positive conductive strip is attached to ends of the first electrode set and at least one negative conductive strip is attached to ends of the second electrode set.

15. The woven active fiber composite according to claim 14, further comprising an epoxy matrix applied to the interwoven conductive wire electrodes and piezoelectric fibers and to the conductive strips.

16. The woven active fiber composite according to claim 14, wherein the conductive wire electrode is woven with the piezoelectric fiber in a smooth manner to substantially prevent sharp points in the conductive wire electrode.

17. The woven active fiber composite according to claim 14, wherein the curved peripheral portion has a length that is at least as large as an eighth of a circumference of the piezoelectric fiber.

18. The woven active fiber composite according to claim 14, wherein the curved peripheral portion has a length that is at least as large as a quarter of a circumference of the piezoelectric fiber.

19. The woven active fiber composite according to claim 18, wherein the curved peripheral portion has a length that is approximately one half of a circumference of the piezoelectric fiber.

* * * * *